United States Patent
Chen et al.

(10) Patent No.: US 11,538,722 B2
(45) Date of Patent: Dec. 27, 2022

(54) OPTICAL DIAGNOSTICS OF SEMICONDUCTOR PROCESS USING HYPERSPECTRAL IMAGING

(71) Applicant: Tokyo Electron Limited, Tokyo (JP)

(72) Inventors: Yan Chen, Fremont, CA (US);
Xinkang Tian, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 196 days.

(21) Appl. No.: 16/880,034

(22) Filed: May 21, 2020

(65) Prior Publication Data

US 2020/0372629 A1 Nov. 26, 2020

Related U.S. Application Data

(60) Provisional application No. 62/851,756, filed on May 23, 2019.

(51) Int. Cl.
  *G01J 3/28* (2006.01)
  *H01L 21/66* (2006.01)
  (Continued)

(52) U.S. Cl.
  CPC ............ *H01L 22/26* (2013.01); *G01J 3/2823* (2013.01); *G01N 21/71* (2013.01);
  (Continued)

(58) Field of Classification Search
  CPC ..... H01L 22/26; H01L 21/3065; H01L 22/12; G01J 3/2823; G01J 2003/2826;
  (Continued)

(56) References Cited

U.S. PATENT DOCUMENTS 3,059,611 A 10/1962 Fury
3,612,692 A 10/1971 Kruppa
(Continued)

FOREIGN PATENT DOCUMENTS

CN 101038860 A 9/2007
CN 101221891 A 7/2008
(Continued)

OTHER PUBLICATIONS

Ming-Jie Sun et al. Single-Pixel Imaging and Its Application in Three-Dimensional Reconstruction: A Brief Review. Sensors (Basel, Switzerland). Feb. 11, 2019. pp. 1-14. DOI:10.3390/s19030732.
(Continued)

*Primary Examiner* — Abdullahi Nur
(74) *Attorney, Agent, or Firm* — Oblon, McClelland, Maier & Neustadt, L.L.P.

(57) ABSTRACT

Disclosed are embodiments of an improved apparatus and system, and associated methods for optically diagnosing a semiconductor manufacturing process. A hyperspectral imaging system is used to acquire spectrally-resolved images of emissions from the plasma, in a plasma processing system. Acquired hyperspectral images may be used to determine the chemical composition of the plasma and the plasma process endpoint. Alternatively, a hyperspectral imaging system is used to acquire spectrally-resolved images of a substrate before, during, or after processing, to determine properties of the substrate or layers and features formed on the substrate, including whether a process endpoint has been reached; or before or after processing, for inspecting the substrate condition.

16 Claims, 6 Drawing Sheets

(51) Int. Cl.
*G01N 21/71* (2006.01)
*G01N 21/95* (2006.01)
*G01N 21/88* (2006.01)
*H01J 37/32* (2006.01)
*H01L 21/3065* (2006.01)
*G06T 7/00* (2017.01)
*G01N 21/84* (2006.01)

(52) U.S. Cl.
CPC ..... *G01N 21/8806* (2013.01); *G01N 21/9501* (2013.01); *G06T 7/0004* (2013.01); *H01J 37/32963* (2013.01); *H01L 21/3065* (2013.01); *G01J 2003/2826* (2013.01); *G01N 2021/8461* (2013.01); *G01N 2021/8845* (2013.01); *G06T 2207/30148* (2013.01); *H01J 2237/24514* (2013.01); *H01J 2237/334* (2013.01)

(58) Field of Classification Search
CPC ...... G01J 3/0297; G01J 3/0208; G01J 3/0218; G01J 3/26; G01J 3/443; G01N 21/71; G01N 21/8806; G01N 21/9501; G01N 2021/8461; G01N 2021/8845; G01N 21/73; G06T 7/0004; G06T 2207/30148; H01J 37/32963; H01J 2237/24514; H01J 2237/334
See application file for complete search history.

(56) References Cited

U.S. PATENT DOCUMENTS

| | | | |
|---|---|---|---|
| 4,147,435 A | 4/1979 | Habegger | |
| 5,308,414 A | 5/1994 | O'Neill et al. | |
| 5,450,205 A * | 9/1995 | Sawin | H01J 37/32935 216/60 |
| 6,060,328 A | 5/2000 | En et al. | |
| 6,081,334 A | 6/2000 | Grimbergen et al. | |
| 6,535,779 B1 | 3/2003 | Birang et al. | |
| 6,564,114 B1 | 5/2003 | Toprac et al. | |
| 6,582,618 B1 | 6/2003 | Toprac et al. | |
| 6,657,736 B1 | 12/2003 | Finarov et al. | |
| 6,745,095 B1 | 6/2004 | Ben-Dov et al. | |
| 6,830,939 B2 | 12/2004 | Harvey et al. | |
| 6,979,578 B2 | 12/2005 | Venugopal | |
| 7,328,126 B2 | 2/2008 | Chamness | |
| 7,864,344 B1 | 1/2011 | Finarov et al. | |
| 8,048,326 B2 | 11/2011 | Yue et al. | |
| 8,173,451 B1 | 5/2012 | Tian et al. | |
| 8,415,884 B2 | 4/2013 | Chen et al. | |
| 9,330,990 B2 | 5/2016 | Chen et al. | |
| 9,677,935 B2 | 6/2017 | Learmonth et al. | |
| 9,927,299 B2 | 3/2018 | Learmonth et al. | |
| 10,002,804 B2 | 6/2018 | Chen et al. | |
| 10,012,542 B2 | 7/2018 | Learmonth et al. | |
| 10,024,717 B2 | 7/2018 | Learmonth et al. | |
| 10,168,214 B2 | 1/2019 | Etchin et al. | |
| 10,323,985 B2 | 6/2019 | Nissim et al. | |
| 10,438,825 B2 | 10/2019 | Jain et al. | |
| 10,578,487 B2 | 3/2020 | Learmonth et al. | |
| 2002/0048019 A1 | 4/2002 | Sui et al. | |
| 2008/0014748 A1 | 1/2008 | Perry | |
| 2008/0018890 A1* | 1/2008 | Maity | G01J 3/0297 257/E31.063 |
| 2008/0186473 A1 | 8/2008 | Lee | |
| 2008/0291428 A1 | 11/2008 | Taraboukhine | |
| 2011/0174776 A1 | 7/2011 | Kabe et al. | |
| 2012/0085494 A1 | 4/2012 | Uchida et al. | |
| 2012/0132617 A1 | 5/2012 | Matsushima | |
| 2014/0106477 A1 | 4/2014 | Chen et al. | |
| 2014/0139822 A1 | 5/2014 | Lange | |
| 2016/0379802 A1 | 12/2016 | Oh | |
| 2018/0052099 A1 | 2/2018 | Hill | |

FOREIGN PATENT DOCUMENTS

| | | |
|---|---|---|
| CN | 102282654 A | 12/2011 |
| CN | ZL201380054482.2 | 6/2017 |
| EP | 0652415 A1 | 10/1994 |
| JP | 6033453 B2 | 11/2016 |
| KR | 101780874 B1 | 9/2017 |
| KR | 20190036891 A | 4/2019 |
| TW | I518525 B | 1/2016 |
| WO | WO 2018/044904 A1 | 3/2018 |

OTHER PUBLICATIONS

PCT International Search Report and Written Opinion issued in counterpart PCT application PCT/US2020/033939, dated Sep. 11, 2020.
Fong, Alexandre, et al. "Hyperspectral Imaging: Hyperspectral Microscopy Serves Biological Pathology." Laser Focus World, Aug. 1, 2018.
M. Morháč "Deconvolution methods and their applications in the analysis of gamma-ray spectra", ACAT2005, May 22-27, Zeuthen Germany.
Rivenson, Yair, et al. "Deep learning microscopy," Optica 4, 1437-1443, 2017.
Rivenson, Yair, et al. "Deep learning microscopy: supplementary material" Optica 4, Nov. 11, 2017.
David Allan White, "Multivariate Analysis of Spectral Measurement for the Characterization of Semiconductor Processes", Dissertation presented Aug. 31, 2001, at Massachusetts Institute of Technology.
Brian E. Goodlin, "Multivariate Endpoint Detection of Plasma Etching Processes", Dissertation presented Apr. 2002, at Massachusetts Institute of Technology.
Yue, Qin, Wiseman, Toprac, "Plasma etching endpoint detection using multiple wavelengths for small open-area wafers", J. Vac Sci. Technol., A 19, 66 (2001).
White, Goodlin, Gower, Boning, Chen, Sawin, Dalton, "Low-Open Area Endpoint Detection using a PCA based T2 Statistic and Q Statistic on Optical Emission Spectroscopy Measurements", IEEE Transactions on Semiconductor Manufacturing, vol. 13, Issue:2, May 2000, pp. 193-207.
Brian E. Goodlin, Duane S. Boning, Herbert H. Sawin, "Quantitative Analysis and Comparison of Endpoint Detection Based on Multiple Wavelength Analysis", 201st Meeting of the Electrochemical Society, International Symposium on Plasma Processing XIV, Abs. 415, Philadelphia, PA, May 2002.
Peter L.G. Ventzek, et al., "Formation, nature, and stability of the arsenic-silicon-oxygen alloy for plasma doping of non-planar silicon structures," Applied Physics Letters 105, pp. 262102-1-262102-5, 2014.
Office Action dated Feb. 28. 2022, in co-pending U.S. Appl. No. 16/880,042, citing AH-AJ therein, 30 pages.

* cited by examiner

OPTICAL DIAGNOSTICS OF SEMICONDUCTOR PROCESS USING HYPERSPECTRAL IMAGING

CROSS REFERENCE TO RELATED APPLICATIONS

This application is related to and claims a priority benefit from U.S. Provisional Patent Application No. 62/851,756, entitled "OPTICAL DIAGNOSTICS OF A SEMICONDUCTOR PROCESS USING HYPERSPECTRAL IMAGING", filed on May 23, 2019, the entire contents of which are herein incorporated by reference. This application is related to co-pending U.S. patent application Ser. No. 16/820,032, entitled "ENHANCED RESOLUTION IN SEMICONDUCTOR FABRICATION DATA ACQUISITION INSTRUMENTS USING MACHINE LEARNING", filed on Mar. 16, 2020, the entire contents of which are herein incorporated by reference.

BACKGROUND OF THE INVENTION

Field of the Invention

The present invention relates to an apparatus and system, and associated methods for optically diagnosing a state of a semiconductor manufacturing process. More specifically, it relates to the use of hyperspectral imaging for diagnosing a semiconductor manufacturing process and the state of the substrate being processed.

Description of Related Art

Optical diagnostics have entered mainstream semiconductor manufacturing processes, and are currently used for diagnosing many different types of semiconductor manufacturing processes, with or without a plasma. Processes where optical diagnostics can be used to measure process parameters and process outcome include patterning with photolithography, etching, deposition, cleaning processes, etc.

Many optical diagnostic methods utilize measuring optical spectra, which are typically acquired using compact on-tool spectrometers. In plasma processes, such as etching and atomic layer etching (ALE), optical emission spectra from an etching plasma can be acquired and analyzed for process endpoint detection (EPD), and for determining other parameters of the plasma etch process, such as the chemical composition of the plasma processing environment. Example techniques, commonly grouped under the term optical emission spectroscopy (OES), are described in more detail in U.S. Pat. Nos. 9,330,990 and 10,002,804, entitled "METHOD OF ENDPOINT DETECTION OF PLASMA ETCHING PROCESS USING MULTIVARIATE ANALYSIS", U.S. patent application Ser. Nos. 15/469,303 and 15/469,317, entitled "CONTROLLING DRY ETCH PROCESS CHARACTERISTICS USING WAFERLESS DRY CLEAN OPTICAL EMISSION SPECTROSCOPY", and U.S. Pat. No. 10,436,717, entitled "COMPOSITIONAL OPTICAL EMISSION SPECTROSCOPY FOR DETECTION OF PARTICLE INDUCED ARCS IN AN ETCH PROCESS", the contents of which are herein incorporated by reference in their entirety.

An optical emission spectroscopy (OES) endpoint signal indicates that a particular layer has been etched through and the underlying layer has been exposed during an etch process, as manifested by a change of the optical emission spectra of the etching plasma. While the feature sizes of semiconductor devices continuously shrink, increasing demands are being brought on endpoint detection (EPD) by low-open area plasma etching processes, where the plasma spectral signatures of the etch-through condition are becoming weaker. This necessitates the use of spectrometers of progressively higher signal to noise ratio (SNR) to be able to capture the etch endpoint accurately. At the same time, the demands of the etch process itself dictate that high throughput be maintained, i.e. that optical spectra are acquired by the spectrometer at a fast enough rate to enable precise endpoint detection (EPD). These demands and the tradeoffs they bring are further amplified in cyclical plasma etching processes, such as atomic layer etching (ALE), where plasma conditions vary widely between steps of a cycle, and transition portions of each cycle are dominated by fast transient phenomena in the plasma.

In another family of optical diagnostic methods, spectrometers are used to measure the spectral content of a broadband beam reflected from the surface of a workpiece (e.g. wafer, substrate, etc.), during the process. These optical diagnostic methods, falling into groups commonly known as scatterometry and reflectometry, do not generally rely on plasma optical emission (but may) and are thus applicable to a wider range of semiconductor manufacturing processes, both plasma and non-plasma. Acquired broadband optical spectra created by reflecting and diffracting an illumination beam from structures and features on the substrate can be utilized in a number of different applications. Examples include detecting an endpoint of a process, for measuring thicknesses of layers formed on a substrate, for measuring dimensions of structures or features formed on the substrate, for measuring characteristics of material(s) of which the layers and features on the substrate are formed, etc. Common to all these methods is that the optical diagnostic specifically targets the layers and features on the substrate being processed, to diagnose and control the process. Some example techniques are described in more detail in U.S. Pat. No. 9,059,038, entitled "SYSTEM FOR IN-SITU FILM STACK MEASUREMENT DURING ETCHING AND ETCH CONTROL METHOD", U.S. patent application Ser. No. 15/472,494, entitled "ADVANCED OPTICAL SENSOR, SYSTEM, AND METHODOLOGIES FOR ETCH PROCESS MONITORING", and U.S. patent application Ser. No. 16/051,082, entitled "NORMAL-INCIDENT IN-SITU PROCESS MONITOR SENSOR", the contents of which are herein incorporated by reference in their entirety.

In a conventional spectrometer with a grating or other dispersing optical element, the signal to noise ratio (SNR) of the spectrometer is generally highly inversely proportional to its throughput. Achieving a higher signal to noise ratio (SNR) requires the acquisition of a stronger optical signal in every pixel of the detector array, whose elements or pixels correspond to wavelengths of the acquired optical spectrum. Traditional means for increasing signal are (a) increasing the spectrometer inlet slit width, and (b) increasing the acquisition time. The former method, typically used in conjunction with a focus lens or mirror with a larger numerical aperture (NA), while effective for increasing the amount of light that reaches the detector array and thus improving the signal-noise-ratio (SNR), has the drawback of reducing spectral resolution. This can result in the inability of the spectrometer to resolve closely spaced spectral peaks. This loss of spectral information may render the acquired spectra unsuitable for diagnosing and controlling the process. The latter method is undesirable for reducing the throughput of the spectrometer, because increasing the acquisition time to allow more signal to be collected at the detector array pixel decreases the rate at which optical spectra are acquired. This reduction of throughput can be detrimental in methods such as endpoint detection (EPD), in which precise timing of the process endpoint is of paramount importance.

With present demands of process diagnostics, particularly etch diagnostics, the aforementioned tradeoffs are becoming more severe with every new generation of devices and processes. Therefore, the need exists for a new spectrometer design and optical diagnostic system to be used in in-situ semiconductor processing diagnostics and control, which does not require sacrificing throughput and spectral resolution for increasing signal to noise ratio (SNR), or which minimizes these tradeoffs.

To that end, this invention proposes a system and method for optical diagnostics and control of a semiconductor manufacturing process using hyperspectral imaging technology as replacement for a conventional spectrometer.

Because hyperspectral imaging is an imaging technique, it is applicable to an even wider range of optical diagnostic methods in semiconductor processing. For example, optical diagnostics that involve imaging of the substrate or region(s) of the substrate to determine the state of the substrate and structures and layers formed thereupon, where the diagnostics would benefit from the knowledge of full spectral information afforded by hyperspectral imaging, are all good candidates for the use of this technology. Examples of optical diagnostics where hyperspectral imaging can be employed include various optical imaging inspection steps, such as after-develop inspection (ADI) in photolithographic patterning processes, various imaging defect inspection steps, detection of contamination on the substrate, etc.

SUMMARY OF THE INVENTION

The present invention relates to methods, and multiple embodiments of an apparatus and system for hyperspectral imaging, to diagnose the state of a substrate during semiconductor processing, and/or to optically diagnose and control the state of a semiconductor manufacturing process itself.

In one embodiment, an optical detector for detecting an optical signal from a semiconductor processing system is provided. The optical detector is configured for detecting an optical signal transmitted through a window mounted in a wall of the semiconductor processing system. The optical detector comprises collecting optics, configured for collecting and transmitting the optical signal transmitted by the window; a wavelength tunable filter for tunably selecting a wavelength of the transmitted optical signal; an array detector for detecting the wavelength-filtered optical signal; and a controller for controlling at least the wavelength tunable filter and array detector, and for storing and processing images acquired by the array detector. The optical detector can be used for detecting an optical signal comprising a plasma optical emission, as in an optical emission spectroscopy (OES) application, including e.g. endpoint detection (EPD). The optical detector can also be used for detecting a diffracted optical signal, where the diffracted optical signal is generated by reflecting and diffracting an illumination beam from a surface of a substrate in the semiconductor processing system. The illumination beam and diffracted optical signal can have normal incidence upon the substrate, or the optical detector can be configured for oblique (non-normal) incidence upon the substrate. Collecting lenses, steering mirrors, apertures, optical fibers, polarizers, etc., can comprise the collecting optics. The wavelength tunable filter can comprise, but is not limited to a tunable Fabry Perot cavity, an acousto-optic tunable filter, and a liquid crystal tunable filter. Depending on the requirements of the application, the array detector can be one-dimensional or two-dimensional, and it can comprise but is not limited to a CCD detector array, a CMOS detector array, a photodiode array, etc. The controller may be configured to selectively tune a passband wavelength of the wavelength tunable filter across a range or multiple overlapping or non-overlapping ranges of wavelengths in the deep ultraviolet (DUV), ultraviolet (UV), visible (VIS), and infrared (IR) portions of the optical spectrum. The controller may further be configured to acquire image cubes, each image cube being consisted of a set of images acquired by the array detector, where each image in the set was acquired at a wavelength defined by an instantaneous passband wavelength to which the wavelength tunable filter was tuned. In one embodiment, the optical detector can be used in a semiconductor substrate inspection system, for inspecting (by imaging) substrates during or after completion of a processing step. The inspection system can be part of a semiconductor processing system, or the inspection system can be a standalone, kiosk-type inspection system.

Further embodiments include a semiconductor processing system and a semiconductor substrate inspection system equipped with the above optical detector. The semiconductor processing system may be a plasma or non-plasma processing system, or a mixed chamber type processing system. The semiconductor substrate inspection system can be either part of a semiconductor processing system, or it can be a standalone kiosk-type inspection system.

A further embodiment includes a method for diagnosing a plasma process step in a plasma processing system, comprising igniting a plasma in a plasma processing chamber of the plasma processing system; collecting a plasma optical emission signal through a window mounted in a wall of the plasma processing chamber, and through collecting optics; directing the plasma optical emission signal from the collecting optics into a wavelength tunable filter for tunably selecting a wavelength of the collected plasma optical emission signal; detecting the wavelength-filtered plasma optical emission signal using an array detector; and storing and processing images acquired by the array detector, in a controller. The method can further comprise selectively tuning a passband wavelength of the wavelength tunable filter, across a range or multiple overlapping or non-overlapping ranges of wavelengths in the deep ultraviolet (DUV), ultraviolet (UV), visible (VIS), and infrared (IR) portions of the optical spectrum. The method can yet further comprise forming an image cube, the image cube consisted of a set of images detected by the array detector, each image in the set being acquired at a wavelength defined by an instantaneous passband wavelength to which the wavelength tunable filter is tuned. The method can be used for determining an endpoint of the plasma process step from a sequence of plasma optical emission spectra formed from a sequence of image cubes acquired during the plasma process step. It can also be used for determining a relative concentration of a chemical constituent of the plasma from a plasma optical emission spectrum formed from an image cube.

A yet further embodiment includes a method for measuring a property of a layer or structure formed on a substrate disposed in a semiconductor processing system, comprising initiating a process step in the semiconductor processing system; illuminating the substrate with an illumination beam, the portion of the illumination beam reflected and diffracted from the substrate forming a diffracted optical signal; collecting the diffracted optical signal through a window mounted in a wall of the semiconductor processing system, and through collecting optics; directing the diffracted optical signal from the collecting optics into a wavelength tunable filter for tunably selecting a wavelength of the collected diffracted optical signal; detecting the wavelength-filtered diffracted optical signal using an array detector; and storing and processing images acquired by the array detector in a controller. The property of a layer or structure on the substrate can be a profile top critical dimension (CD), a profile bottom critical dimension (CD), a profile middle critical dimension (CD), a profile sidewall angle, a layer thickness, a layer optical property, a remaining thickness of a layer being etched, etc. Furthermore, an endpoint of the process step can be determined from a sequence of diffracted optical spectra derived from a sequence of image cubes acquired during the process step.

The method can further comprise determining a spatial correspondence of locations on the substrate and pixel locations in images of an image cube and deriving a diffracted optical spectrum from an image cube. A diffracted optical spectrum can be derived from a single selected pixel location across all images or a subset of images in an image cube, or cubes. A diffracted optical spectrum can also be derived from at least one selected region of pixel locations across all images or a selected subset of images in an image cube, or cubes. Lastly, the diffracted optical spectrum can be derived from all pixel locations across all images or a selected subset of images in an image cube, or cubes.

The same above three steps for extracting a diffracted optical spectrum from an image cube, or cubes, can also be used for extracting plasma optical emission spectra from an image cube, or cubes, in a plasma diagnostics application. In that case, pixel locations in images of an image cube do not correspond to locations on the substrate, but to regions of the probe volume in the plasma processing chamber, from which plasma optical emission signal is acquired.

These same steps can further be used for extracting optical spectra from an image cube, or cubes, in a substrate inspection system.

In a substrate inspection system, an embodiment of a method of inspecting a substrate comprises placing the substrate on a stage in the substrate inspection system; illuminating the substrate with an illumination light source; collecting an optical signal caused by illuminating the substrate, through collecting optics; directing the collected optical signal from the collecting optics into a wavelength tunable filter for tunably selecting a wavelength of the collected optical signal; detecting the wavelength-filtered signal using an array detector; and storing and processing images acquired by the array detector in a controller. The method can further comprise determining at least one property of the substrate, or of a layer or structure formed on the substrate from at least one optical spectrum derived from an image cube in accordance with the previously described methods of extracting spectra from images.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EXEMPLARY EMBODIMENTS

In the following description, in order to facilitate a thorough understanding of the invention and for purposes of explanation and not limitation, specific details are set forth, such as particular geometries of an optical detector, a plasma processing system, a non-plasma semiconductor processing system, an optical imaging inspection system, and descriptions of various components and processes. However, it should be understood that the invention may be practiced in other embodiments that depart from these specific details.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Operations described may be performed in a different order than the described embodiment. Various additional operations may be performed and/or described operations may be omitted in additional embodiments.

Figure 1A:
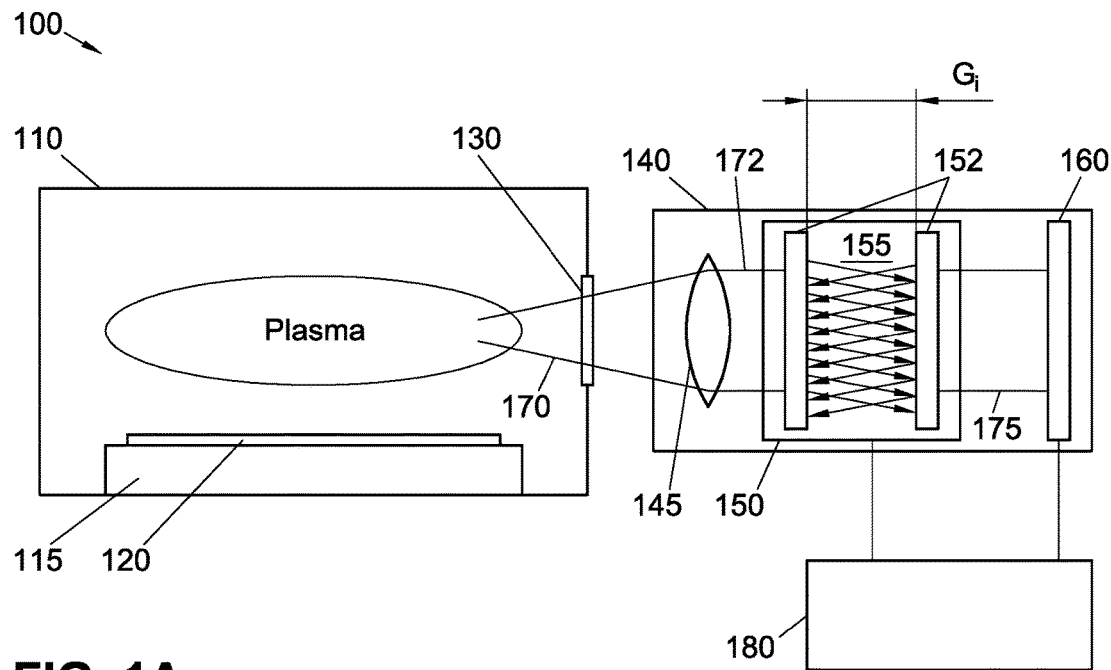
FIG. 1A is a schematic view of a plasma processing system with an optical detector in accordance with an embodiment of the invention.
Figure 1B:
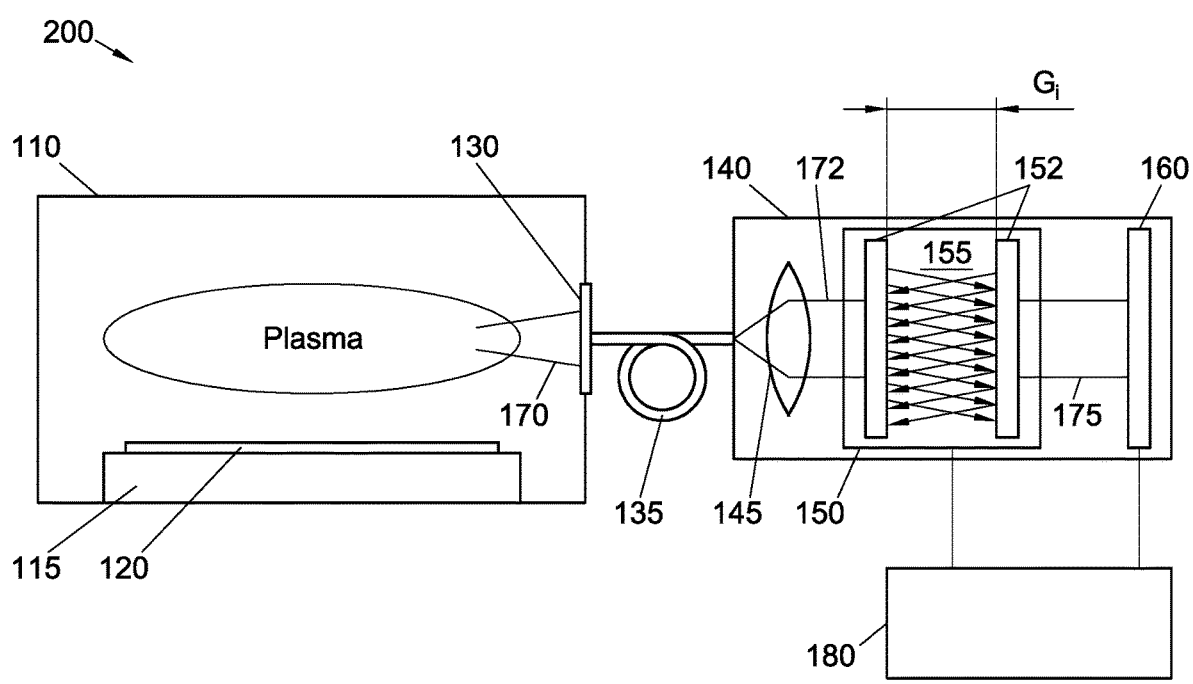
FIG. 1B is a schematic view of a plasma processing system with an optical detector in accordance with another embodiment of the invention.

FIGS. 1A and 1B show semiconductor processing systems in accordance with embodiments of the invention. FIG. 1A depicts an exemplary semiconductor processing system that utilizes a plasma to process substrates, e.g. an etch processing system, an atomic layer etch (ALE) system, a deposition system, etc., hereinafter referred to as plasma processing system 100. The plasma processing system 100 comprises a plasma processing chamber 110, which can further comprise an inductive plasma source (ICP), a capacitive plasma source (CCP), a transformer coupled plasma source (TCP), a microwave plasma source, a surface wave plasma source (SWP), etc. (not shown). Along with a gas-supply system (not shown), the plasma source is used to strike and maintain a plasma inside the plasma processing chamber 110, above substrate 120 that is disposed atop a support member 115. The support member 115 can be an electrostatic chuck (ESC), a susceptor, etc.

An optical detector 140 is used to monitor the state of the plasma inside plasma processing chamber 110. A window 130 is provided in the side wall of plasma processing chamber 110, to allow an optical signal, in this case the plasma optical emission signal 170 to exit the plasma processing chamber 110 and enter the optical detector 140. In an alternate embodiment, the window 130 may be mounted on the top wall of plasma processing chamber 110, and the optical detector 140 may in that case be mounted above the plasma processing chamber 110, or the plasma optical emission signal 170 may be routed using e.g. an optical fiber to a remotely-located optical detector 140. The window 130 can be made of suitable materials transparent to the deep ultraviolet (DUV), ultraviolet (UV), visible (VIS), and infrared (IR) portions of the optical spectrum. For example, the window 130 can comprise various types of glass e.g. borosilicate glass, quartz, sapphire, etc. Provisions for protecting the window 130 from excessive deposition of material from the plasma may be provided, such as perforated grids, purge gas injection systems, etc. (not shown).

The optical detector 140 comprises collecting optics 145, a wavelength tunable filter 150, and an array detector 160, which together comprise a hyperspectral imaging (HSI) system. The optical detector and its components are controlled by a controller 180 in communication with at least the wavelength tunable filter 150 and the array detector 160. The wavelength tunable filter can comprise a Fabry Perot cavity, an acousto-optic tunable filter, a liquid crystal tunable filter, or any other tunable narrowband optical filter device capable of varying the passband wavelength, as selected and controlled by controller 180. Depending on the application, the array detector 160 can be a one-dimensional array detector (i.e. line detector) or two-dimensional array detector. The array detector 160 can comprise a CCD detector array, a CMOS detector array, a photodiode array, or a combination of detectors of various kinds for different portions of the array detector 160, if the application so demands. For example, different array detector types can be used, side-by-side or stacked, for different wavelength ranges, due to their inherent differences in wavelength sensitivity, etc.

In operation, the plasma optical emission signal 170 is collected by collecting optics 145 and directed into the wavelength tunable filter 150 as transmitted optical signal 172. Collecting optics 145 can comprise any combination of collecting lenses, steering mirrors, apertures, polarizers, optical fibers, etc., needed to form the transmitted optical signal 172. FIG. 1A shows an example of a Fabry Perot cavity, in which two semireflective mirrors 152 are spaced by a controllable gap $G_i$, forming an optical cavity 155. As the spacing $G_i$ is varied by controller 180, different passband wavelengths are selectively transmitted by the Fabry Perot cavity to form the wavelength-filtered optical signal 175, which is incident on the array detector 160. An exemplary suitable Fabry Perot cavity is the Model 4200 HinaLea Hyperspectral Imager, available from TruTag Technologies. This Fabry Perot cavity which is integrated with a 2.3 MegaPixel array detector, has a spectral range from 200 to 1000 nm, and a maximum of 600 spectral bands.

In operation, the controller 180 controls the controllable gap $G_i$ to execute a sweep of passband wavelengths, while the array detector 160 simultaneously acquires images which are subsequently received by the controller 180, where they can be stored and/or processed. As the passband wavelength of wavelength tunable filter 150 is varied, each image acquired by the array detector 160 will be acquired at the instantaneous passband wavelength selected by the wavelength tunable filter 150. In this manner, an "image stack", or "image cube", hereinafter, is acquired for each sweep of passband wavelength of the wavelength tunable filter 150, and received by controller 180 (see FIGS. 5A-C). Passband wavelength sweeps can be repeated to acquire successive image cubes. The controller 180 can be programmed, for example, to execute a continuous sweep of passband wavelength, from the minimum to the maximum passband wavelength of the wavelength tunable filter 150. In practice, however, only certain portions of the optical spectrum may be of interest, so the controller 180 may be programmed to selectively tune a passband wavelength across a range or multiple overlapping or non-overlapping ranges of wavelengths in the deep ultraviolet (DUV), ultraviolet (UV), visible (VIS), and infrared (IR) portions of the optical spectrum. In this fashion, throughput is increased as only the wavelength ranges of interest are acquired.

For a Fabry Perot cavity, typical times to switch and set a passband wavelength are in the neighborhood of 0.1 ms, thus allowing e.g. 100 passband wavelengths to be selected and corresponding images formed by array detector 160, in 10 ms. While this spectra-acquisition speed may be lower than that of some high performance spectrometers, the benefit of the hyperspectral imaging (HSI) system is that the amount of light accepted via the plasma optical emission signal 170 is not limited by the slit width of the spectrometer and the numerical aperture (NA) of the collection optics. Indeed, a large effective aperture can be used in the collecting optics 145, resulting in a strong signal detected by array detector 160, thus significantly increasing the signal to noise ratio (SNR) over a traditional spectrometer. With a typical spectral resolution of 2 nm for a Fabry Perot cavity, a high signal to noise ratio (SNR) and good spectral resolution are combined in a single optical detector 140 employing a hyperspectral imaging (HSI) system. If the throughput of a single optical detector 140 is insufficient for the application, multiple optical detectors 140 may be used, operating in parallel, each acquiring a portion of the plasma optical emission spectrum.

Figure 5A:
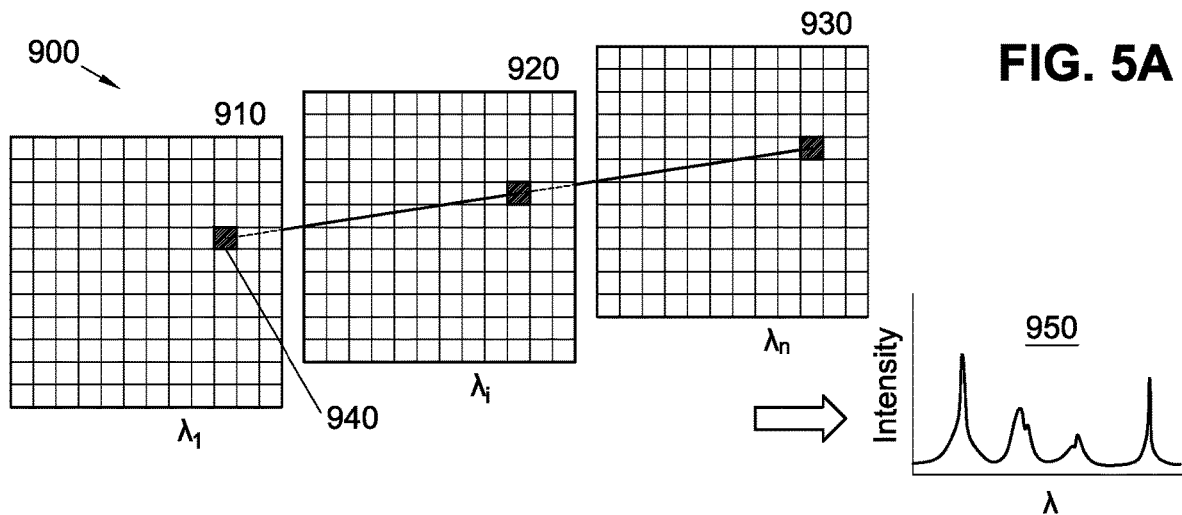
FIGS. 5A-C are schematic views of steps for extracting optical spectra from acquired image cubes, in accordance with embodiments of the invention.
Figure 5B:
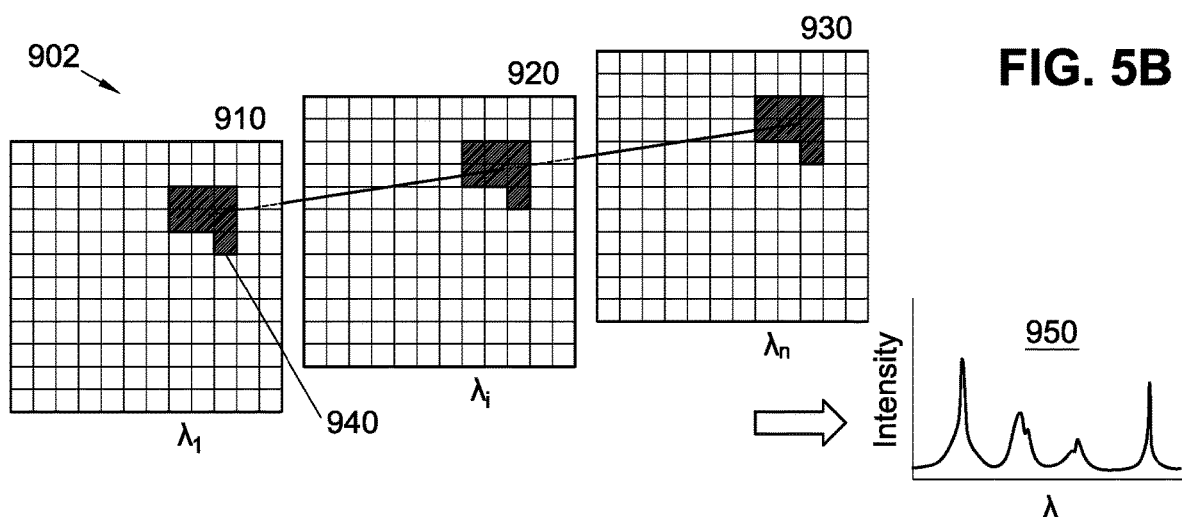
Figure 5C:
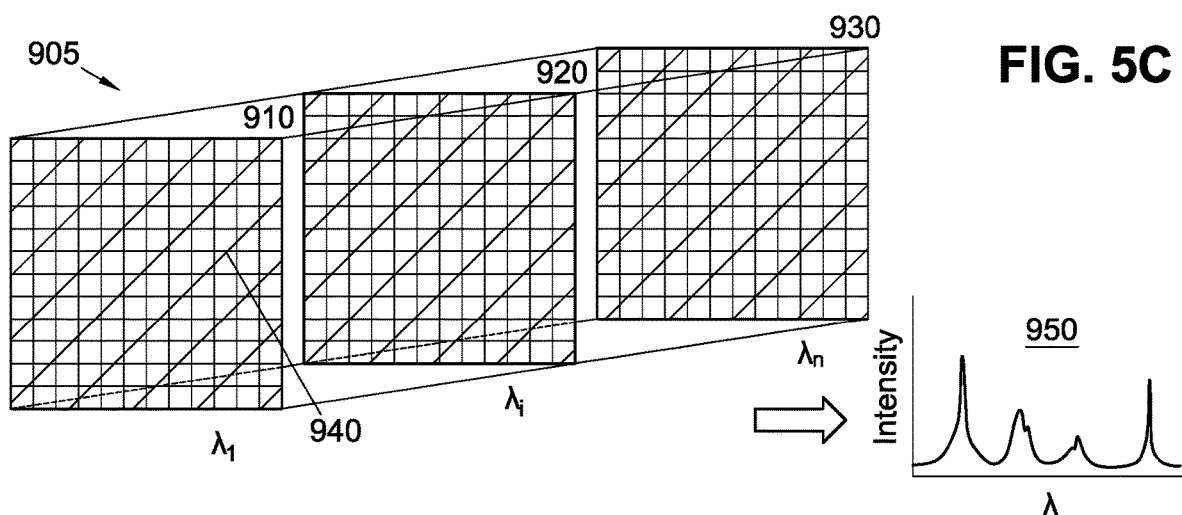

Plasma optical diagnostics rely on acquisition of plasma optical emission spectra, as described before. FIGS. 5A-C show the process of extracting plasma optical emission spectra from exemplary acquired image cubes 900, 902, and 905. In FIG. 5A, an image cube 900 is acquired at n passband wavelengths varied from $\lambda_1$, through $\lambda_i$, to $\lambda_n$. In this simplest embodiment, plasma optical emission spectra are extracted by extracting light intensities from a same single selected pixel 940 in all images of image cube 900. When the extracted light intensities are arranged in ascending wavelength order, a plasma optical emission spectrum 950 of FIG. 5A is obtained, which can be further utilized in the same way as a spectrum obtained from a traditional spectrometer.

Alternatively, in FIG. 5B, the plasma optical emission spectra are extracted by extracting and averaging light intensities across at least one selected region of pixels 940 in all images of image cube 902. Multiple noncontiguous regions of pixels 940 may be selected and averaged, depending on the application, which would dictate which portions of an image to retain and which portions to discard. Various averaging methods, pixel weighted and unweighted, can be used to arrive at an average light intensity across selected region(s) of pixels 940, for each image acquired at each wavelength $2u$. Once averaged, the average extracted light intensities are arranged in ascending wavelength order to form a plasma optical emission spectrum 950 of FIG. 5B.

Alternatively yet, in FIG. 5C, the plasma optical emission spectra are extracted by extracting and averaging light intensities across all pixels 940 of acquired images of image cube 905. Various averaging methods, pixel weighted and unweighted, can be used to arrive at an average light intensity across pixels 940, for each image acquired at each wavelength $\lambda_i$. Once averaged, the average extracted light intensities are arranged in ascending wavelength order to form a plasma optical emission spectrum 950 of FIG. 5C.

When forming plasma optical emission spectra 950 as described in FIGS. 5A-C, all images in an image cube 900, 902, or 905 may be used to form plasma optical emission spectra 950. Alternatively, only a subset of images in image cubes 900, 902, 905 may be used to form plasma optical emission spectra 950, thereby eliminating portions of the spectra that are not needed for a given application. For example, in an endpoint detection (EPD) application, only certain narrow portions of the plasma optical emission spectrum may be of interest. This reducing the number of images (i.e. number of passband wavelengths) acquired in an image cube, in the first place, and further selecting only a subset of images in an image cube for plasma optical emission spectra extraction can significantly increase the computational efficiency of the algorithm for endpoint detection (EPD). The same efficiency gains can be seen in other possible applications, such as actinometry applications, where plasma optical emission spectra are used to determine the relative concentration of at least one chemical constituent of the plasma.

In plasma optical diagnostics, due to the configuration of collection opting 145 of FIG. 1A, pixel locations in two-dimensional images in image cubes 900, 902, and 905 of FIGS. 5A-C correspond generally to different regions in the plasma which are imaged onto the individual pixels of array detector 160. One can advantageously select one of methods of FIGS. 5A and 5B to select exactly the regions in the plasma for being probed, such that, for example, more reliable endpoint detection (EPD) is achieved. At the same time, using the methods of FIGS. 5A and 5B allows portions of the plasma optical emissions to be eliminated, where, for example, interference from structures in the plasma processing chamber 110, or the substrate 120 is strong. Furthermore, the same above principles of plasma optical emission spectra extraction apply in the case of one-dimensional images, if a one-dimensional array detector 160 is used. In plasma optical diagnostics where binning and averaging across many pixels in one direction is not required, one-dimensional array detectors 160 (i.e. line detectors) may be advantageously used to reduce the cost of optical detector 140 and increase processing speed and throughput.

If higher spectral resolution is required than can be obtained by the selected type of wavelength tunable filter 150, a spectral deconvolution method can be used to reconstruct high resolution spectra from the acquired plasma optical emission spectra 950. An example spectral deconvolution method is disclosed in M. Morháč "Deconvolution methods and their applications in the analysis of gamma-ray spectra", ACAT2005, May 22-27, Zeuthen Germany. Alternatively, machine-learning techniques disclosed in co-pending U.S. patent application Ser. No. 16/820,032, entitled "ENHANCED RESOLUTION IN SEMICONDUCTOR FABRICATION DATA ACQUISITION INSTRUMENTS USING MACHINE LEARNING", filed on Mar. 16, 2020 can be utilized to reconstruct higher resolution spectra from the acquired plasma optical emission spectra 950.

In FIG. 1B, in which like reference numbers denote the same elements as in FIG. 1A, is shown a plasma processing system 200 which differs from plasma processing system 100 of FIG. 1A only in the use of an optical fiber 135 to feed the plasma optical emission signal 170 into optical detector 140. The use of an optical fiber 135 provides for added flexibility in locating window 130, which can be mounted on a side wall or on the top wall of plasma processing chamber 110. The optical fiber 135 allows further flexibility in remotely locating optical detector 140. The optical fiber 135 couples the plasma optical emission signal 170 and transmits it to the collecting optics 145, and can include coupling optics, multiple fiber bundles, etc., to ensure the proper coupling of the plasma optical emission signal 170 and for best transmission along the fiber. In all other respects, the functions and operation of plasma processing system 200 are similar or identical to that of plasma processing system 100, of FIG. 1A, as previously described.

Figure 2A:
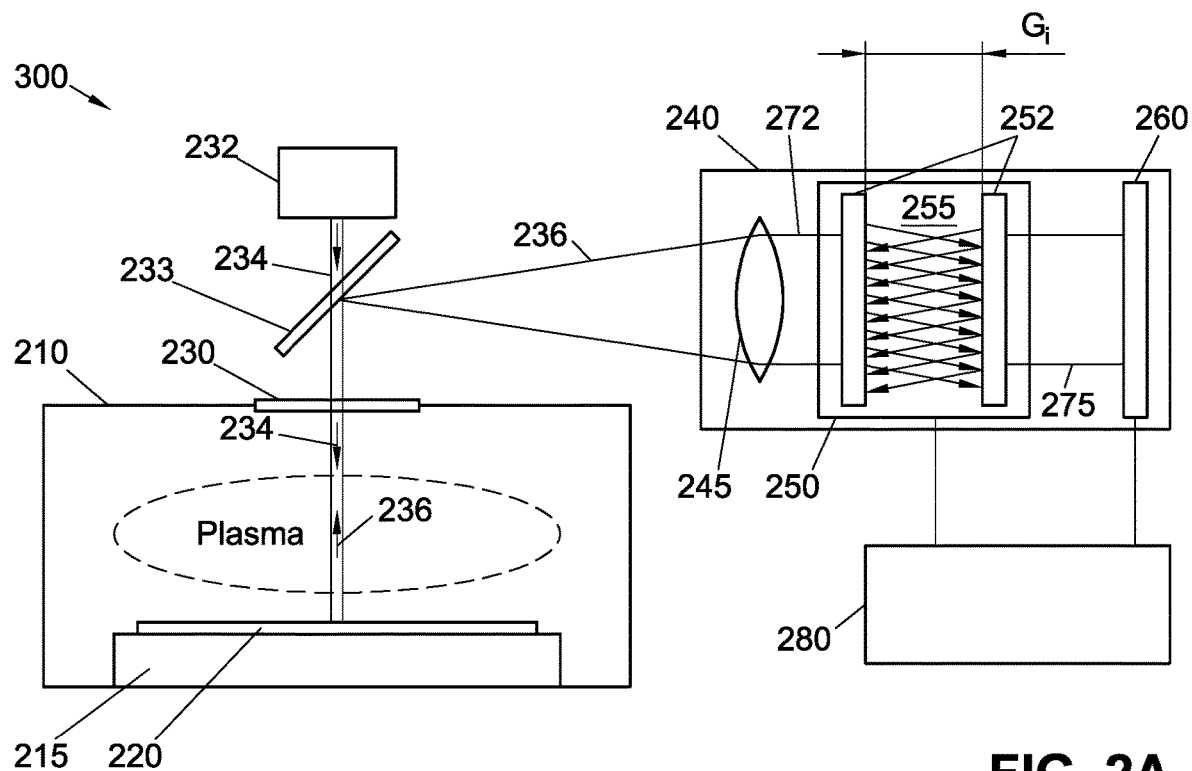
FIG. 2A is a schematic view of a semiconductor processing system with an optical detector configured for normal incidence, in accordance with an embodiment of the invention.
Figure 2B:
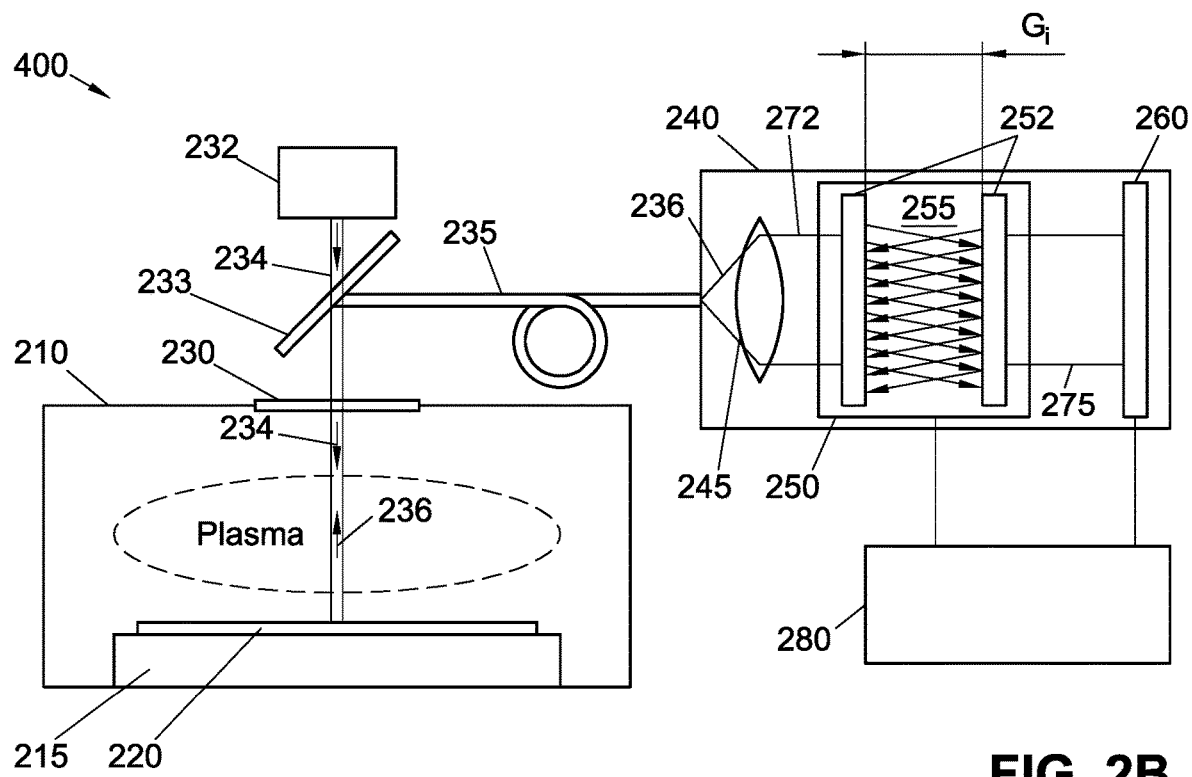
FIG. 2B is a schematic view of a semiconductor processing system with an optical detector configured for normal incidence, in accordance with another embodiment of the invention.

FIGS. 2A and 2B show semiconductor processing systems in accordance with further embodiments of the invention. FIG. 2A depicts an exemplary semiconductor processing system 300. Semiconductor processing system 300 may or may not utilize a plasma for processing, and can comprise or be a part of a photolithographic track system, an etch system, an atomic layer etch (ALE) system, a deposition system, a wet or dry cleaning system, a diffusion furnace system, or any other semiconductor processing system where the progress of a process step needs to be monitored for purposes of ensuring substrates meet the specifications, and for process step control. Semiconductor processing system 300 comprises a process module 210 with a support member 215 for supporting substrate 220 during the process step. The support member 215 can be an electrostatic chuck (ESC), a susceptor, a movable stage, part of a platen/substrate arm, etc. A process step is performed on the substrate 220 inside process module 210, during which layers or features may be formed or altered on substrate 220. For example, in an etch system, layers and features on the substrate may be etched. In a photolithographic track system, a photoresist coating may be applied, baked, or removed. In a deposition system, layers may be deposited on the substrate. In a wet or dry cleaning system, features, layers, processing liquids, contaminants, etc., may be removed from the substrate.

An optical detector 240 is used to monitor the state of the substrate inside semiconductor processing system 300 and process module 210, during the process step, using reflectometry. An illumination beam 234 is created by a broadband illumination light source 232, and is directed at normal incidence (zero angle of incidence) at the substrate 220, through semireflective mirror 233, and window 230 disposed opposing substrate 220. Some process modules 210 may not have walls, i.e. they may not be enclosed and isolated from their surroundings, in which case window 230 may not be necessary. The illumination light source can be continuous wave (CW), or pulsed light source, and it can cover light wavelength ranges in the deep ultraviolet (DUV), ultraviolet (UV), visible (VIS), and infrared (IR) portions of the optical spectrum. The illumination light source 232 can comprise various incandescent and gas discharge light sources, flash lamps, LEDs, lasers, laser-driven plasma light sources (LDLS), etc. If a particularly wide range of light wavelengths is used for reflectometry, illumination light source 232 may comprise multiple light sources, each covering a different light wavelength range, with beams combined using a suitable beam combiner optic. Illumination light source 232 may also include a shutter (not shown), to modulate illumination beam 234 such that interference from a plasma or other emissions acquired when the shutter is closed, can be subtracted from measured reflectometer signals. The window 230 can be made of suitable materials transparent to the deep ultraviolet (DUV), ultraviolet (UV), visible (VIS), and infrared (IR) portions of the optical spectrum. For example, the window 230 can comprise various types of glass e.g. borosilicate glass, quartz, sapphire, etc. Provisions for protecting the window 230 from excessive deposition of material from a plasma or other aggressive environments inside the process module 210 may be provided, such as perforated grids, purge gas injection systems, etc. (not shown).

Upon incidence on substrate 220, illumination beam 234 is reflected and diffracted due to the presence of layers or structures or features formed atop substrate 220, to form a diffracted optical signal 236. The diffracted optical signal 236 comprises the zeroth order diffracted optical signal reflected from substrate 220 at a normal (zero) angle of reflection. As was discussed before, the spectra of the diffracted optical signal 236 contain information from which properties of layers or structures or features on the substrate 220, can be determined. The diffracted optical signal 236 passes through window 230, if present, and is reflected by semireflective mirror 233 into optical detector 240.

The optical detector 240 comprises collecting optics 245, a wavelength tunable filter 250, and an array detector 260, which together comprise a hyperspectral imaging (HSI) system. The optical detector and its components are controlled by a controller 280 in communication with at least the wavelength tunable filter 250 and the array detector 260. The wavelength tunable filter can comprise a Fabry Perot cavity, an acousto-optic tunable filter, a liquid crystal tunable filter, or any other tunable narrowband optical filter device capable of varying the passband wavelength, as selected and controlled by controller 280. Depending on the application, the array detector 260 can be a one-dimensional array detector (i.e. line detector) or two-dimensional array detector. The array detector 260 can comprise a CCD detector array, a CMOS detector array, a photodiode array, or a combination of detectors of various kinds for different portions of the array detector 260, if the application so demands. For example, different array detector types can be used, side-by-side or stacked, for different wavelength ranges, due to their inherent differences in wavelength sensitivity, etc.

In operation, the diffracted optical signal 236 is collected by collecting optics 245 and directed into the wavelength tunable filter 250 as transmitted optical signal 272. Collecting optics 245 can comprise any combination of collecting lenses, steering mirrors, apertures, polarizers, optical fibers, etc., needed to form the transmitted optical signal 272. FIG. 2A shows an example of a Fabry Perot cavity, in which two semireflective mirrors 252 are spaced by a controllable gap $G_i$, forming an optical cavity 255. As the spacing $G_i$ is varied by controller 280, different passband wavelengths are selectively transmitted by the Fabry Perot cavity to form the wavelength-filtered diffracted optical signal 275, which is incident on the array detector 260.

In operation, the controller 280 controls the controllable gap $G_i$ to execute a sweep of passband wavelengths, while the array detector 260 simultaneously acquires images which are subsequently received by the controller 280, where they can be stored and/or processed. As the passband wavelength of wavelength tunable filter 250 is varied, each image acquired by the array detector 260 will be acquired at the instantaneous passband wavelength selected by the wavelength tunable filter 250. In this manner, an "image stack", or "image cube", hereinafter, is acquired for each sweep of passband wavelength of the wavelength tunable filter 250, and received by controller 280 (see FIGS. 5A-C). Passband wavelength sweeps can be repeated to acquire successive image cubes. The controller 280 can be programmed, for example, to execute a continuous sweep of passband wavelength, from the minimum to the maximum passband wavelength of the wavelength tunable filter 250. In practice, however, only certain portions of the optical spectrum may be of interest, so the controller 280 may be programmed to selectively tune a passband wavelength across a range or multiple overlapping or non-overlapping ranges of wavelengths in the deep ultraviolet (DUV), ultraviolet (UV), visible (VIS), and infrared (IR) portions of the optical spectrum. In this fashion, throughput is increased as only the wavelength ranges of interest are acquired.

For a Fabry Perot cavity, typical times to switch and set a passband wavelength are in the neighborhood of 0.1 ms, thus allowing e.g. 100 passband wavelengths to be selected and corresponding images formed by array detector 260, in 10 ms. While this spectra-acquisition speed may be lower than that of some high performance spectrometers, the benefit of the hyperspectral imaging (HSI) system is that the amount of light accepted via the diffracted optical signal 236 is not limited by the slit width of the spectrometer and the numerical aperture (NA) of the collection optics. Indeed, a large effective aperture can be used in the collecting optics 245, resulting in a strong signal detected by array detector 260, thus significantly increasing the signal to noise ratio (SNR) over a traditional spectrometer. With a typical spectral resolution of 2 nm for a Fabry Perot cavity, a high signal to noise ratio (SNR) and good spectral resolution are combined in a single optical detector 240 employing a hyperspectral imaging (HSI) system. If the throughput of a single optical detector 240 is insufficient for the application, multiple optical detectors 240 may be used, operating in parallel, each acquiring a portion of the diffracted optical signal 236, which may be previously split using suitable beam splitters or other wavelength-selective optics.

Reflectometry relies on acquisition of diffracted optical spectra, as described before. FIGS. 5A-C show the process of extracting diffracted optical spectra from exemplary acquired image cubes 900, 902, and 905. In FIG. 5A, an image cube 900 is acquired at n passband wavelengths varied from $\lambda_1$, through $\lambda_i$, to $\lambda_n$. In this simplest embodiment, diffracted optical spectra are extracted by extracting light intensities from a same single selected pixel 940 in all images of image cube 900. When the extracted light intensities are arranged in ascending wavelength order, a diffracted optical spectrum 950 of FIG. 5A is obtained, which can be further utilized in the same way as a spectrum obtained from a traditional spectrometer.

Alternatively, in FIG. 5B, the diffracted optical spectra are extracted by extracting and averaging light intensities across at least one selected region of pixels 940 in all images of image cube 902. Multiple noncontiguous regions of pixels 940 may be selected and averaged, depending on the application, which would dictate which portions of an image to retain and which portions to discard. Various averaging methods, pixel weighted and unweighted, can be used to arrive at an average light intensity across selected region(s) of pixels 940, for each image acquired at each wavelength $\lambda_i$. Once averaged, the average extracted light intensities are arranged in ascending wavelength order to form a diffracted optical spectrum 950 of FIG. 5B.

Alternatively yet, in FIG. 5C, the diffracted optical spectra are extracted by extracting and averaging light intensities across all pixels 940 of acquired images of image cube 905. Various averaging methods, pixel weighted and unweighted, can be used to arrive at an average light intensity across pixels 940, for each image acquired at each wavelength $\lambda_i$. Once averaged, the average extracted light intensities are arranged in ascending wavelength order to form a diffracted optical spectrum 950 of FIG. 5C.

When forming diffracted optical spectra 950 as described in FIGS. 5A-C, all images in an image cube 900, 902, or 905 may be used to form diffracted optical spectra 950. Alternatively, only a subset of images in image cubes 900, 902, 905 may be used to form diffracted optical spectra 950, thereby eliminating portions of the spectra that are not needed for a given application. For example, in an endpoint detection (EPD) application, only certain narrow portions of the diffracted optical spectrum may be of interest. This reducing the number of images (i.e. number of passband wavelengths) acquired in an image cube, in the first place, and further selecting only a subset of images in an image cube for diffracted optical spectra extraction can significantly increase the computational efficiency of the algorithm for endpoint detection (EPD). The same efficiency gains can be seen in other possible applications, such as CD measurement, feature profile measurement, determination of optical properties of layers on the substrate, etc.

In reflectometry, due to the configuration and location of collecting optics 245, semireflective mirror 233, etc, with respect to the substrate 220, pixel locations in two-dimensional images in image cubes 900, 902, and 905 of FIGS. 5A-C correspond to different locations on the substrate 220, which are imaged onto individual pixels of array detector 260. This spatial correspondence of pixel locations and locations on the substrate 220 can either be determined by optical modeling or by using acquired images to verify the image field of view on substrate 220. With the known spatial correspondence, one of methods of FIGS. 5A and 5B can be advantageously used to select exactly the regions on the substrate 220 for being diagnosed, such that, for example, more reliable endpoint detection (EPD) is achieved. This allows portions of the substrate surface to be eliminated if these portions do not meaningfully contribute to the reflectometry signal (e.g. areas that do not etch, areas with different layers or features and optical properties thereof, scribe lines, interfering process module structures, etc.)

In one embodiment, successive acquired images of image cubes (for the same passband wavelength $\lambda_i$) can be analyzed for pixels or regions of pixels of rapidly changing light intensity between successive images (which indicates, for example, etching at these locations). In one embodiment, the rate of change of light intensity of pixels or regions of pixels can be compared to a pre-selected threshold rate of change of light intensity, to determine if a pixel or region of pixels undergoes rapid light intensity change, and thus processing. These pixels or regions of pixels of rapidly changing light intensity can be used as regions 940 for extraction of diffracted optical spectra 950. This approach eliminates the requirement for the knowledge of the spatial correspondence of pixel locations and locations on the substrate, and eliminates the need for selecting regions of pixels for diffracted optical spectra extraction, in advance. At the same time, this approach ensures that only regions on the substrate where processing occurs are diagnosed, and all other regions are ignored, thereby improving accuracy of the diagnostics.

A further advantage of the ability to select only certain region(s) of pixels 940 in images of the image cube is that it allows a relatively large illuminated spot and field of view of optical detector 240 on substrate 220 to be used. This simplifies the optical setup, loosens dimensional tolerances, and reduces the cost of optical detector 240 and the entire semiconductor processing system 300. Lastly, it relaxes the tolerances of positioning of substrate 220 atop support member 215, because the required region(s) of pixels 940 can always be found in the images of the image cube, as long as they are within the field of view of optical detector 240.

If higher spectral resolution is required than can be obtained by the selected type of wavelength tunable filter 250, a spectral deconvolution method can be used to reconstruct high resolution spectra from the acquired diffracted optical spectra 950. An example spectral deconvolution method is disclosed in M. Morháč "Deconvolution methods and their applications in the analysis of gamma-ray spectra", ACAT2005, May 22-27, Zeuthen Germany. Alternatively, machine-learning techniques disclosed in co-pending U.S. patent application Ser. No. 16/820,032, entitled "ENHANCED RESOLUTION IN SEMICONDUCTOR FABRICATION DATA ACQUISITION INSTRUMENTS USING MACHINE LEARNING", filed on Mar. 16, 2020 can be utilized to reconstruct higher resolution spectra from the acquired diffracted optical spectra 950.

Properties that can be determined by reflectometry include remaining thickness of films atop structures on the substrate, layer thicknesses, critical dimensions (CDs), such as top, middle, and bottom critical dimensions, profile dimensions such as profile height, sidewall angle, etc., optical properties of layers on the substrate, etc. The remaining thickness of a film is a measured quantity that is useful for determining an endpoint of an etch process. Indeed, the inventors have demonstrated a five-fold improvement of remaining thickness control in a FINFET etch process, over a timed etch, by using a reflectometry with a hyperspectral imaging (HSI) system.

In FIG. 2B, in which like reference numbers denote the same elements as in FIG. 2A, is shown a semiconductor processing system 400 which differs from semiconductor processing system 300 of FIG. 2A only in the use of an optical fiber 235 to feed the diffracted optical signal 236 into optical detector 240. The use of an optical fiber 235 provides for added flexibility in locating optical detector 240. The optical fiber 235 couples the diffracted optical signal 236 and transmits it to the collecting optics 245, and can include coupling optics, multiple fiber bundles, etc., to ensure the proper coupling of the diffracted optical signal 236 and for best transmission along the fiber. In all other respects, the functions and operation of semiconductor processing system 400 are similar or identical to those of semiconductor processing system 300, of FIG. 2A, as previously described.

Figure 3A:
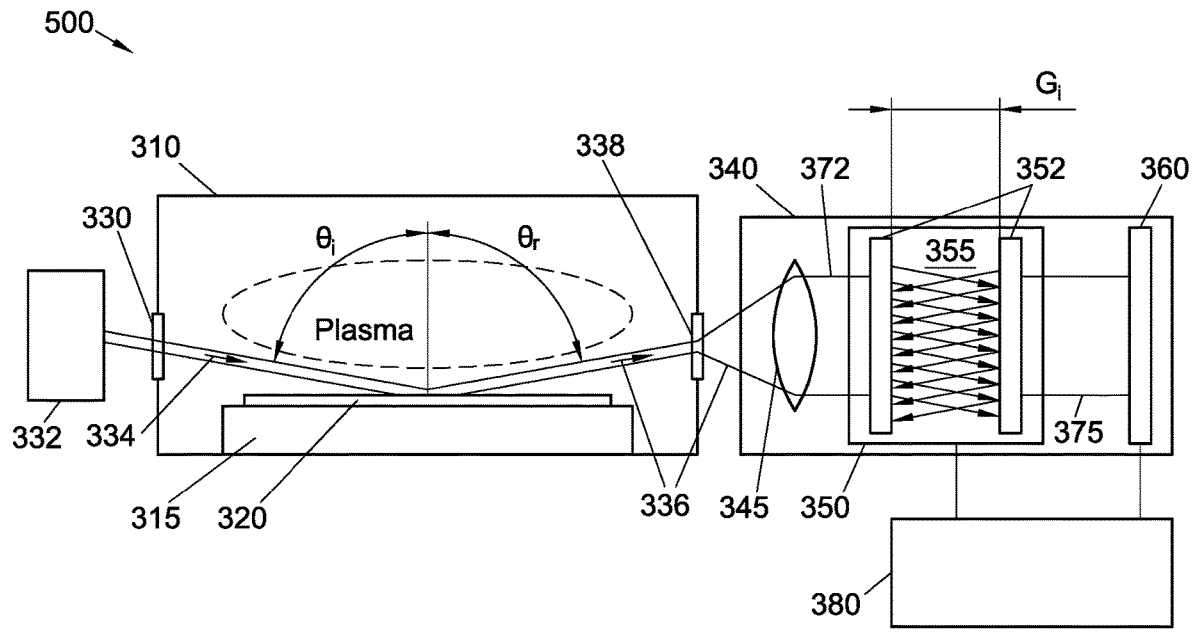
FIG. 3A is a schematic view of a semiconductor processing system with an optical detector configured for oblique incidence, in accordance with an embodiment of the invention.
Figure 3B:
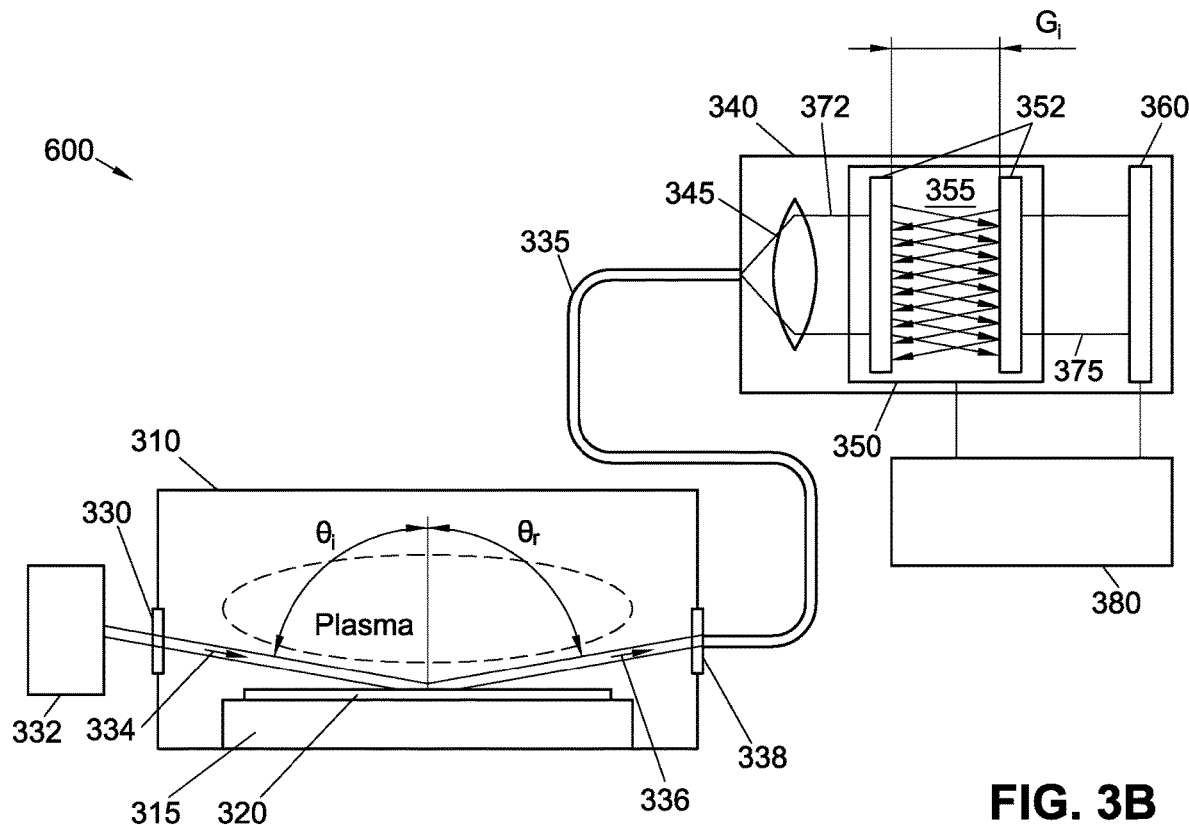
FIG. 3B is a schematic view of a semiconductor processing system with an optical detector configured for oblique incidence, in accordance with another embodiment of the invention.

FIGS. 3A and 3B show semiconductor processing systems in accordance with yet further embodiments of the invention. FIG. 3A depicts an exemplary semiconductor processing system 500. Semiconductor processing system 500 may or may not utilize a plasma for processing, and can comprise or be a part of a photolithographic track system, an etch system, an atomic layer etch (ALE) system, a deposition system, a wet or dry cleaning system, a diffusion furnace system, or any other semiconductor processing system where the progress of a process step needs to be monitored for purposes of ensuring substrates meet the specifications, and for process step control. Semiconductor processing system 500 comprises a process module 310 with a support member 315 for supporting substrate 320 during the process step. The support member 315 can be an electrostatic chuck (ESC), a susceptor, a movable stage, part of a platen/substrate arm, etc. A process step is performed on the substrate 320 inside process module 310, during which layers or features may be formed or altered on substrate 320. For example, in an etch system, layers and features on the substrate may be etched. In a photolithographic track system, a photoresist coating may be applied, baked, or removed. In a deposition system, layers may be deposited on the substrate. In a wet or dry cleaning system, features, layers, processing liquids, contaminants, etc., may be removed from the substrate.

An optical detector 340 is used to monitor the state of the substrate inside semiconductor processing system 500 and process module 310, during the process step, using reflectometry. An illumination beam 334 is created by a broadband illumination light source 332, and is directed at oblique incidence at the substrate 320, through window illumination window 330. The angle of incidence $\theta_i$ of illumination beam 334 can vary from 0.1° to 89°, the angle of incidence being chosen based on a number of factors, including sensitivity of the reflectometer to the types and geometries of features and structures being formed on substrate 320, constraints imposed by the geometry of process module 310, etc. Some process modules 310 may not have walls, i.e. they may not be enclosed and isolated from their surroundings, in which case illumination window 330 may not be necessary. The illumination light source can be continuous wave (CW), or pulsed light source, and it can cover light wavelength ranges in the deep ultraviolet (DUV), ultraviolet (UV), visible (VIS), and infrared (IR) portions of the optical spectrum. The illumination light source 332 can comprise various incandescent and gas discharge light sources, flash lamps, LEDs, lasers, laser-driven plasma light sources (LDLS), etc. If a particularly wide range of light wavelengths is used for reflectometry, illumination light source 332 may comprise multiple light sources, each covering a different light wavelength range, with beams combined using a suitable beam combiner optic. Illumination light source 332 may also include a shutter (not shown), to modulate illumination beam 334 such that interference from a plasma or other emissions acquired when the shutter is closed, can be subtracted from measured reflectometer signals. The illumination window 330 can be made of suitable materials transparent to the deep ultraviolet (DUV), ultraviolet (UV), visible (VIS), and infrared (IR) portions of the optical spectrum. For example, the illumination window 330 can comprise various types of glass e.g. borosilicate glass, quartz, sapphire, etc. Provisions for protecting the illumination window 330 from excessive deposition of material from a plasma or other aggressive environments inside the process module 310 may be provided, such as perforated grids, purge gas injection systems, etc. (not shown).

Upon oblique incidence on substrate 320, illumination beam 334 is reflected and diffracted due to the presence of layers or structures or features formed atop substrate 320, to form a diffracted optical signal 336. The diffracted optical signal 336 is reflected from the substrate 320 at an angle of reflection Or, which is equal to the angle of incidence $\theta_i$ of illumination beam 334, and can vary from 0.1° to 89°. The diffracted optical signal 336 may comprise one or more diffraction orders of the optical signal reflected from substrate. As was discussed before, the spectra of the diffracted optical signal 336 contain information from which properties of layers or structures or features on the substrate 320, can be determined. The diffracted optical signal 336 passes through reflection window 338, if present, and is directed into optical detector 340. The reflection window 338 is generally located on the opposite side of process module 310 from illumination window 330, and it can comprise a same or different material from illumination window 330. Provisions for protecting the reflection window 338 from excessive deposition of material from a plasma or other aggressive environments inside the process module 310 may be provided, such as perforated grids, purge gas injection systems, etc. (not shown).

The optical detector 340 comprises collecting optics 345, a wavelength tunable filter 350, and an array detector 360, which together comprise a hyperspectral imaging (HSI) system. The optical detector and its components are controlled by a controller 380 in communication with at least the wavelength tunable filter 350 and the array detector 360. The wavelength tunable filter can comprise a Fabry Perot cavity, an acousto-optic tunable filter, a liquid crystal tunable filter, or any other tunable narrowband optical filter device capable of varying the passband wavelength, as selected and controlled by controller 380. Depending on the application, the array detector 360 can be a one-dimensional array detector (i.e. line detector) or two-dimensional array detector. The array detector 360 can comprise a CCD detector array, a CMOS detector array, a photodiode array, or a combination of detectors of various kinds for different portions of the array detector 360, if the application so demands. For example, different array detector types can be used, side-by-side or stacked, for different wavelength ranges, due to their inherent differences in wavelength sensitivity, etc.

In operation, the diffracted optical signal 336 is collected by collecting optics 345 and directed into the wavelength tunable filter 350 as transmitted optical signal 372. Collecting optics 345 can comprise any combination of collecting lenses, steering mirrors, apertures, polarizers, optical fibers, etc., needed to form the transmitted optical signal 372. FIG. 3A shows an example of a Fabry Perot cavity, in which two semireflective mirrors 352 are spaced by a controllable gap $G_i$, forming an optical cavity 355. As the spacing $G_i$ is varied by controller 380, different passband wavelengths are selectively transmitted by the Fabry Perot cavity to form the wavelength-filtered diffracted optical signal 375, which is incident on the array detector 360.

In operation, the controller 380 controls the controllable gap $G_i$ to execute a sweep of passband wavelengths, while the array detector 360 simultaneously acquires images which are subsequently received by the controller 380, where they can be stored and/or processed. As the passband wavelength of wavelength tunable filter 350 is varied, each image acquired by the array detector 360 will be acquired at the instantaneous passband wavelength selected by the wavelength tunable filter 350. In this manner, an "image stack", or "image cube", hereinafter, is acquired for each sweep of passband wavelength of the wavelength tunable filter 350, and received by controller 380 (see FIGS. 5A-C). Passband wavelength sweeps can be repeated to acquire successive image cubes. The controller 380 can be programmed, for example, to execute a continuous sweep of passband wavelength, from the minimum to the maximum passband wavelength of the wavelength tunable filter 350. In practice, however, only certain portions of the optical spectrum may be of interest, so the controller 380 may be programmed to selectively tune a passband wavelength across a range or multiple overlapping or non-overlapping ranges of wavelengths in the deep ultraviolet (DUV), ultraviolet (UV), visible (VIS), and infrared (IR) portions of the optical spectrum. In this fashion, throughput is increased as only the wavelength ranges of interest are acquired.

For a Fabry Perot cavity, typical times to switch and set a passband wavelength are in the neighborhood of 0.1 ms, thus allowing e.g. 100 passband wavelengths to be selected and corresponding images formed by array detector 360, in 10 ms. While this spectra-acquisition speed may be lower than that of some high performance spectrometers, the benefit of the hyperspectral imaging (HSI) system is that the amount of light accepted via the diffracted optical signal 336 is not limited by the slit width of the spectrometer and the numerical aperture (NA) of the collection optics. Indeed, a large effective aperture can be used in the collecting optics 345, resulting in a strong signal detected by array detector 360, thus significantly increasing the signal to noise ratio (SNR) over a traditional spectrometer. With a typical spectral resolution of 2 nm for a Fabry Perot cavity, a high signal to noise ratio (SNR) and good spectral resolution are combined in a single optical detector 340 employing a hyperspectral imaging (HSI) system. If the throughput of a single optical detector 340 is insufficient for the application, multiple optical detectors 340 may be used, operating in parallel, each acquiring a portion of the diffracted optical signal 336, which may be previously split using suitable beam splitters or other wavelength-selective optics.

If higher spectral resolution is required than can be obtained by the selected type of wavelength tunable filter 350, a spectral deconvolution method can be used to reconstruct high resolution spectra from the acquired diffracted optical spectra 950 (FIGS. 5A, 5B, and 5C). An example spectral deconvolution method is disclosed in M. Morháč "Deconvolution methods and their applications in the analysis of gamma-ray spectra", ACAT2005, May 22-27, Zeuthen Germany. Alternatively, machine-learning techniques disclosed in co-pending U.S. patent application Ser. No. 16/820,032, entitled "ENHANCED RESOLUTION IN SEMICONDUCTOR FABRICATION DATA ACQUISITION INSTRUMENTS USING MACHINE LEARNING", filed on Mar. 16, 2020 can be utilized to reconstruct higher resolution spectra from the acquired diffracted optical spectra 950.

In FIG. 3B, in which like reference numbers denote the same elements as in FIG. 3A, is shown a semiconductor processing system 600 which differs from semiconductor processing system 500 of FIG. 3A in the use of an optical fiber 335 to feed the diffracted optical signal 336 into optical detector 340. The use of an optical fiber 335 provides for added flexibility in locating optical detector 340. The optical fiber 335 couples the diffracted optical signal 336 and transmits it to the collecting optics 345, and can include coupling optics, multiple fiber bundles, etc., to ensure the proper coupling of the diffracted optical signal 336 and for best transmission along the fiber. In all other respects, the functions and operation of semiconductor processing system 600 are similar or identical to those of semiconductor processing system 500, of FIG. 3A, as previously described.

Semiconductor processing systems 300, 400, 500, and 600 all utilize reflectometry for diagnosing the process outcome on the substrate, and their differences include details of the optical setup and angle of incidence and reflection. Thus, the foregoing discussion of methods for extraction of diffracted optical spectra 950 (FIGS. 5A, 5B, and 5C), establishing a spatial correspondence of pixel locations in images of image cubes and locations on the substrate, selecting region(s) of pixels 940 (FIGS. 5A, 5B, and 5C) for extraction of diffracted optical spectra 950, properties of layers and features that can be determined, and the attendant advantages thereof, regarding semiconductor processing systems 300 and 400, all apply also to semiconductor processing systems 500 and 600, and the associated optical detector 340 and controller 380, which use oblique angle of incidence reflectometry.

Besides monitoring the state of a plasma in a plasma processing chamber and using reflectometry to monitor processing of layers and features on substrates (during the process, i.e. in-situ, and after process completion), a hyperspectral imaging (HSI) system can be used to enhance other optical diagnostic methods of spectroscopic and/or imaging nature. For example, hyperspectral imaging (HSI) can be used for multi-spectral inspection of substrates. Applications of multi-spectral inspection of a substrate can include common inspection steps, such as after-develop inspection (ADI) and CD metrology/inspection in photolithography and etch, and various defect detection techniques, for example, detection of contamination, pattern collapse, improper self-assembly of direct self-assembled (DSA) block copolymer layers, etc. Common to all these techniques is the acquisition of images of the substrate, or regions of a substrate, which with a hyperspectral imaging (HSI) system can be done at many wavelengths, dramatically increasing the amount of data available for detection of defects in low signal to noise ratio situations.

Figure 4A:
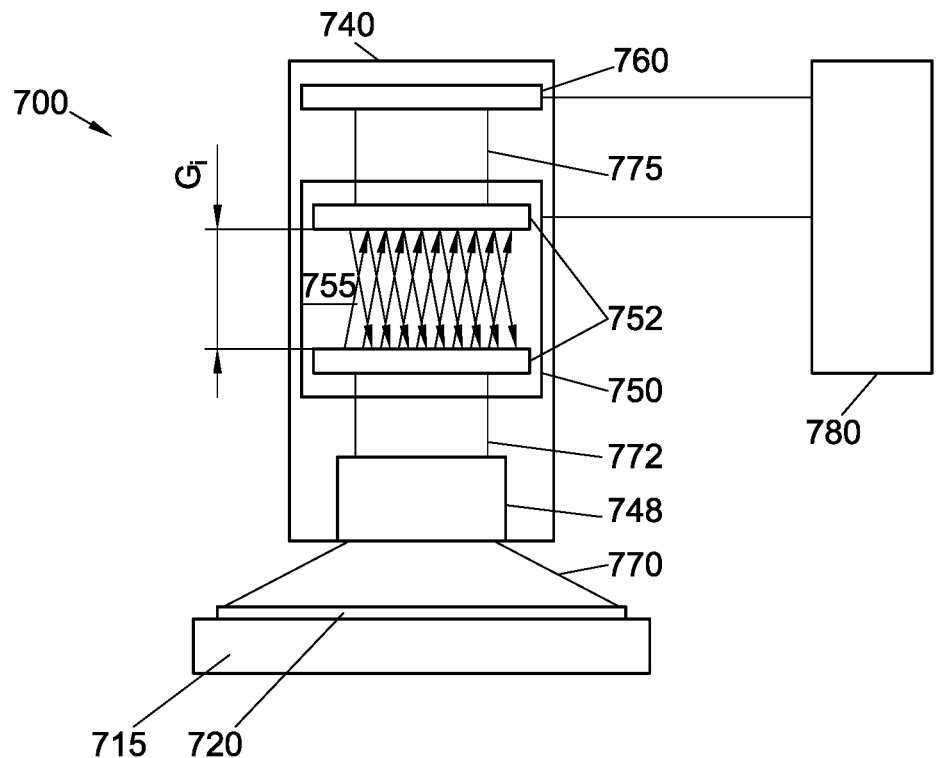
FIG. 4A is a schematic view of a substrate inspection system with an optical detector in accordance with an embodiment of the invention.
Figure 4B:
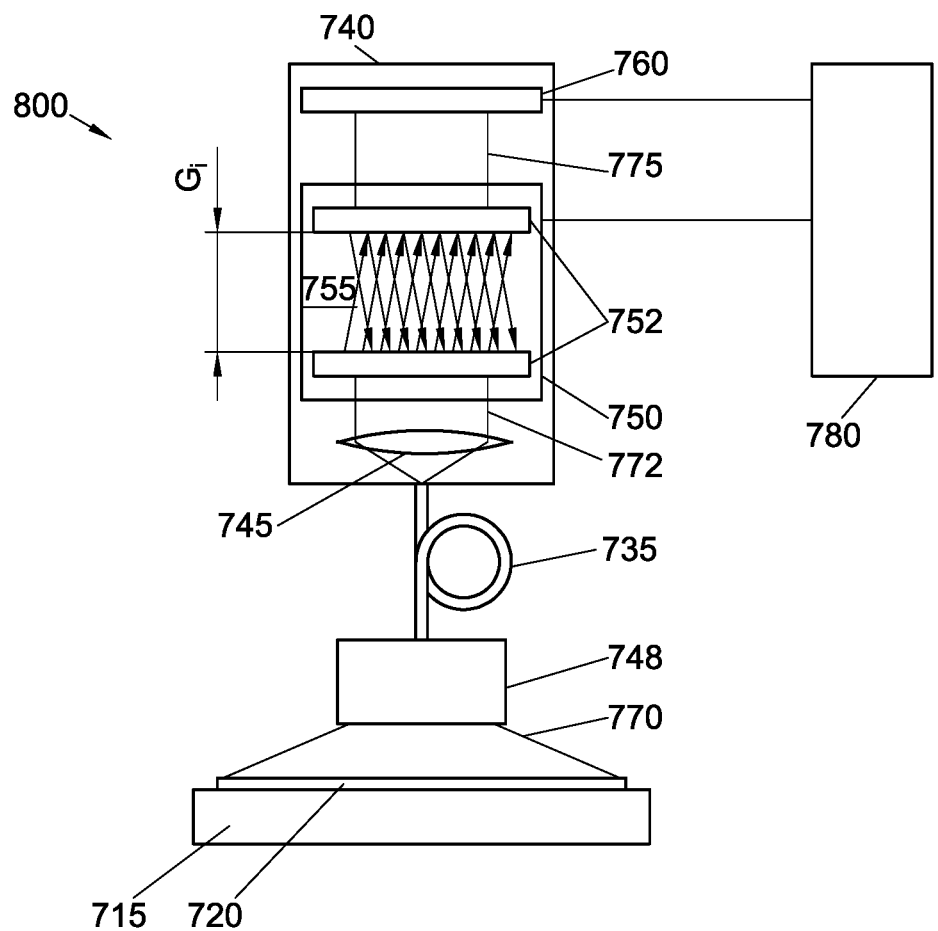
FIG. 4B is a schematic view of a substrate inspection system with an optical detector in accordance with another embodiment of the invention.

FIGS. 4A and 4B show substrate inspection systems in accordance with yet further embodiments of the invention. FIG. 4A depicts an exemplary semiconductor substrate inspection system 700. Substrate inspection system 700 may be part of a semiconductor processing system, or it can be part of a standalone inspection system (e.g. a kiosk type inspection system).

Substrate inspection system 700 comprises a stage 715 for supporting substrate 720 during inspection. The stage 715 can be an electrostatic chuck (ESC), a susceptor, a movable stage (e.g. an X-Y, X-Y-θ, X-Y-Z, or X-Y-Z-θ stage), part of a platen/substrate arm, etc. The substrate inspection system 700 can include further subsystems, such as an enclosure (not shown), a purge gas system (not shown) for maintaining a controlled and clean environment surrounding the substrate 720, etc.

An optical detector 740 is used to image the substrate inside substrate inspection system 700, during an inspection step or process. An illumination light source (not shown) may be used to illuminate the surface of the substrate 720. The illumination light source may be configured for bright field illumination (from above substrate 720) or for dark field illumination (with the illumination beam substantially parallel to the surface of the substrate 720). The illumination light source can be continuous wave (CW), or pulsed light source, and it can cover light wavelength ranges in the deep ultraviolet (DUV), ultraviolet (UV), visible (VIS), and infrared (IR) portions of the optical spectrum. The illumination light source can comprise various incandescent and gas discharge light sources, flash lamps, LEDs, lasers, laser-driven plasma light sources (LDLS), etc., and can include further optics necessary to evenly illuminate the surface of substrate 720. If a particularly wide range of light wavelengths is used for inspection, the illumination light source may comprise multiple light sources, each covering a different light wavelength range, with beams combined using a suitable beam combiner optic. Illumination light source may also include a shutter (not shown), to modulate the illumination beam such that interference from other emissions acquired when the shutter is closed, can be subtracted from measured optical signals.

Upon incidence on substrate 720, portion of the illumination beam is reflected and from substrate 720, to form an optical signal 770. As was discussed before, the spectra of optical signal 770 contain information from which properties of layers or structures or features on the substrate 720, can be determined during the inspection. The optical detector 740 comprises collecting optics 748, a wavelength tunable filter 750, and an array detector 760, which together comprise a hyperspectral imaging (HSI) system. The optical detector and its components are controlled by a controller 780 in communication with at least the wavelength tunable filter 750 and the array detector 760. The wavelength tunable filter can comprise a Fabry Perot cavity, an acousto-optic tunable filter, a liquid crystal tunable filter, or any other tunable narrowband optical filter device capable of varying the passband wavelength, as selected and controlled by controller 780. Depending on the application, the array detector 760 can be a one-dimensional array detector (i.e. line detector) or two-dimensional array detector. The array detector 760 can comprise a CCD detector array, a CMOS detector array, a photodiode array, or a combination of detectors of various kinds for different portions of the array detector 760, if the application so demands. For example, different array detector types can be used, side-by-side or stacked, for different wavelength ranges, due to their inherent differences in wavelength sensitivity, etc.

In operation, the optical signal 770 is collected by collecting optics 748 and directed into the wavelength tunable filter 750 as transmitted optical signal 772. Collecting optics 748 can comprise any combination of collecting lenses, steering mirrors, apertures, polarizers, optical fibers, etc., needed to form the transmitted optical signal 772. FIG. 4A shows an example of a Fabry Perot cavity, in which two semireflective mirrors 752 are spaced by a controllable gap $G_i$, forming an optical cavity 755. As the spacing $G_i$ is varied by controller 780, different passband wavelengths are selectively transmitted by the Fabry Perot cavity to form the wavelength-filtered optical signal 775, which is incident on the array detector 760.

In operation, the controller 780 controls the controllable gap $G_i$ to execute a sweep of passband wavelengths, while the array detector 760 simultaneously acquires images which are subsequently received by the controller 780, where they can be stored and/or processed. As the passband wavelength of wavelength tunable filter 750 is varied, each image acquired by the array detector 760 will be acquired at the instantaneous passband wavelength selected by the wavelength tunable filter 750. In this manner, an "image stack", or "image cube", hereinafter, is acquired for each sweep of passband wavelength of the wavelength tunable filter 750, and received by controller 780 (see FIGS. 5A-C). Passband wavelength sweeps can be repeated to acquire successive image cubes. The controller 780 can be programmed, for example, to execute a continuous sweep of passband wavelength, from the minimum to the maximum passband wavelength of the wavelength tunable filter 750. In practice, however, only certain portions of the optical spectrum may be of interest, so the controller 780 may be programmed to selectively tune a passband wavelength across a range or multiple overlapping or non-overlapping ranges of wavelengths in the deep ultraviolet (DUV), ultraviolet (UV), visible (VIS), and infrared (IR) portions of the optical spectrum. In this fashion, throughput is increased as only the wavelength ranges of interest are acquired.

For a Fabry Perot cavity, typical times to switch and set a passband wavelength are in the neighborhood of 0.1 ms, thus allowing e.g. 100 passband wavelengths to be selected and corresponding images formed by array detector 760, in 10 ms. With a typical spectral resolution of 2 nm for a Fabry Perot cavity, a high signal to noise ratio (SNR) and good spectral resolution are combined in a single optical detector 740 employing a hyperspectral imaging (HSI) system. If the throughput or passband wavelength range of a single optical detector 740 is insufficient for the application, multiple optical detectors 740 may be used, operating in parallel, each acquiring a portion of the optical signal 770, which may be previously split using suitable beam splitters or other wavelength-selective optics.

Multi-spectral substrate inspection relies on acquisition of optical spectra, as described before. FIGS. 5A-C show the process of extracting optical spectra from exemplary acquired image cubes 900, 902, and 905. In FIG. 5A, an image cube 900 is acquired at n passband wavelengths varied from $\lambda_1$, through $\lambda_i$, to $\lambda_n$. In this simplest embodiment, diffracted optical spectra are extracted by extracting light intensities from a same single selected pixel 940 in all images of image cube 900. When the extracted light intensities are arranged in ascending wavelength order, an optical spectrum 950 of FIG. 5A is obtained.

Alternatively, in FIG. 5B, the optical spectra are extracted by extracting and averaging light intensities across at least one selected region of pixels 940 in all images of image cube 902. Multiple noncontiguous regions of pixels 940 may be selected and averaged, depending on the application, which would dictate which portions of an image to retain and which portions to discard. Various averaging methods, pixel weighted and unweighted, can be used to arrive at an average light intensity across selected region(s) of pixels 940, for each image acquired at each wavelength $\lambda_i$. Once averaged, the average extracted light intensities are arranged in ascending wavelength order to form an optical spectrum 950 of FIG. 5B.

Alternatively yet, in FIG. 5C, the diffracted optical spectra are extracted by extracting and averaging light intensities across all pixels 940 of acquired images of image cube 905. Various averaging methods, pixel weighted and unweighted, can be used to arrive at an average light intensity across pixels 940, for each image acquired at each wavelength $\lambda_i$. Once averaged, the average extracted light intensities are arranged in ascending wavelength order to form an optical spectrum 950 of FIG. 5C. In the context of multi-spectral substrate inspection, the methods of FIGS. 5A and 5B are most suitable, as they retain the most image information: method of FIG. 5A retains all pixels, whereas the method of FIG. 5B retains regions of pixels.

When forming optical spectra 950 as described in FIGS. 5A-C, all images in an image cube 900, 902, or 905 may be used to form optical spectra 950. Alternatively, only a subset of images in image cubes 900, 902, 905 may be used to form optical spectra 950, thereby eliminating portions of the spectra that are not needed for a given application. This reducing the number of images (i.e. number of passband wavelengths) acquired in an image cube, in the first place, and further selecting only a subset of images in an image cube for optical spectra extraction can significantly increase the computational efficiency of the algorithm for inspection.

In multi-spectral substrate inspection, due to the configuration and location of collecting optics 748 with respect to the substrate 720, pixel locations in two-dimensional images in image cubes 900, 902, and 905 of FIGS. 5A-C correspond to different locations on the substrate 720, which are imaged onto individual pixels of array detector 760. This spatial correspondence of pixel locations and locations on the substrate 720 can either be determined by optical modeling or by using acquired images to verify the image field of view on substrate 720. With the known spatial correspondence, one of methods of FIGS. 5A and 5B can be advantageously used to select exactly the regions on the substrate 720 for being diagnosed. This allows portions of the substrate surface to be eliminated if these portions do not meaningfully contribute to the inspection outcome.

A further advantage of the ability to select only certain region(s) of pixels 940 in images of the image cube is that it allows a relatively large field of view of optical detector 740, on substrate 720, to be used. This simplifies the optical setup, loosens dimensional tolerances, and reduces the cost of optical detector 740 and the entire substrate inspection system 700. Lastly, it relaxes the tolerances of positioning of substrate 720 atop stage 715, and if the stage 715 is movable, tolerances on its positioning, because the required region(s) of pixels 940 can always be found in the images of the image cube, as long as they are within the field of view of optical detector 740.

If higher spectral resolution is required than can be obtained by the selected type of wavelength tunable filter 750, a spectral deconvolution method can be used to reconstruct high resolution spectra from the acquired optical spectra 950. An example spectral deconvolution method is disclosed in M. Morháč "Deconvolution methods and their applications in the analysis of gamma-ray spectra", ACAT2005, May 22-27, Zeuthen Germany. Alternatively, machine-learning techniques disclosed in co-pending U.S. patent application Ser. No. 16/820,032, entitled "ENHANCED RESOLUTION IN SEMICONDUCTOR FABRICATION DATA ACQUISITION INSTRUMENTS USING MACHINE LEARNING", filed on Mar. 16, 2020 can be utilized to reconstruct higher resolution spectra from the acquired optical spectra 950.

In FIG. 4B, in which like reference numbers denote the same elements as in FIG. 4A, is shown a substrate inspection system 800 which differs from substrate inspection system 700 of FIG. 2A in the use of an optical fiber bundle 735 to feed the optical signal 770 into optical detector 740. The use of an optical fiber bundle 735 provides for added flexibility in locating optical detector 740. The optical fiber bundle 735 couples the optical signal 770 and transmits it to the collecting optics 745 of optical detector 740, and can include and objective lens 748, coupling optics, multiple fiber bundles, etc., to ensure the proper coupling of the optical signal 770 and for best transmission along the fiber. In all other respects, the functions and operation of substrate inspection system 800 are similar or identical to those of substrate inspection system 700, of FIG. 4A, as previously described.

Figure 6A:
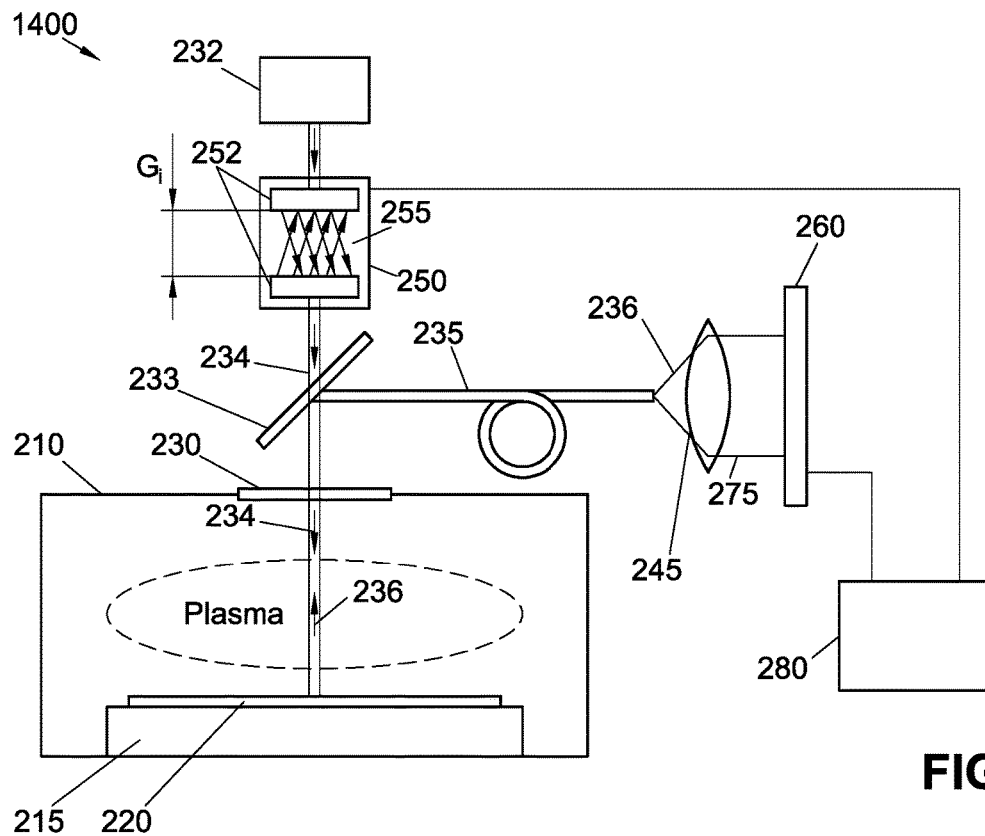
FIG. 6A is a schematic view of a semiconductor processing system with an optical detector configured for normal incidence, in accordance with a further embodiment of the invention.

In FIG. 6A, in which like reference numbers denote the same elements as in FIG. 2B, is shown a semiconductor processing system 1400 in accordance with a further embodiment of the invention, in which the illumination beam wavelength is varied instead of the wavelength selection being applied just prior to the array detector. The semiconductor processing system 1400 differs from semiconductor processing system 400 in having the wavelength tunable filter 250 disposed in the illumination beam 234 between illumination light source 232 and semireflective mirror 233. In this embodiment, variation of the passband wavelength of wavelength tunable optical filter 250 causes the wavelength of illumination beam 234 to vary. Thus, as the passband wavelength of wavelength tunable filter 250 is varied, each image acquired by the array detector 260 will be acquired at the instantaneous passband wavelength selected by the wavelength tunable filter 250. As in semiconductor processing system 400, the controller 280 of semiconductor processing system 1400 controls the controllable gap $G_i$ to execute a sweep of passband wavelengths, and similarly, acquired images are received by the controller 280. In all other respects, the operation of semiconductor processing system 1400 is the same as operation of semiconductor processing system 400, described previously, and acquired "image stacks" or "image cubes" are the same. The same modification of wavelength tunable filter 250 location can also be made in semiconductor processing system 300, of FIG. 2A.

Figure 6B:
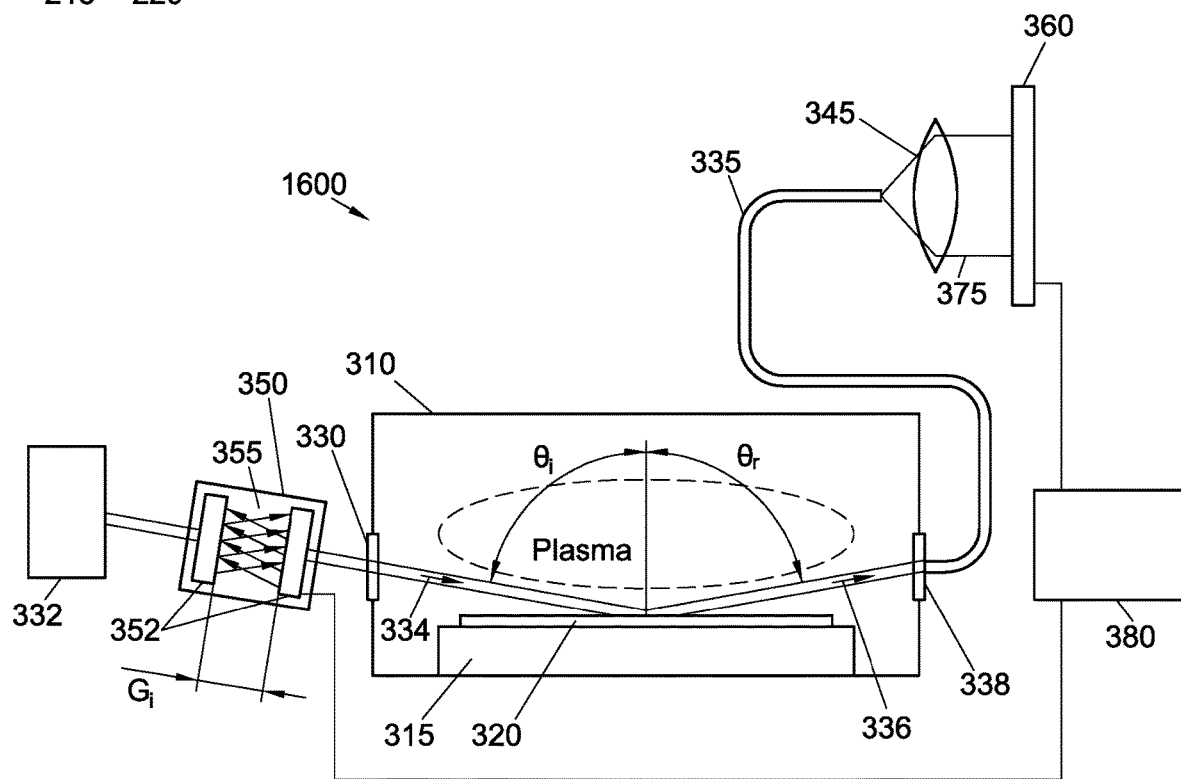
FIG. 6B is a schematic view of a semiconductor processing system with an optical detector configured for oblique incidence, in accordance with a further embodiment of the invention.

In FIG. 6B, in which like reference numbers denote the same elements as in FIG. 3B, is shown a semiconductor processing system 1600 in accordance with a further embodiment of the invention, in which the illumination beam wavelength is varied instead of the wavelength selection being applied just prior to the array detector. The semiconductor processing system 1600 differs from semiconductor processing system 600 in having the wavelength tunable filter 350 disposed in the illumination beam 334 between illumination light source 332 and illumination window 330. In this embodiment, variation of the passband wavelength of wavelength tunable optical filter 350 causes the wavelength of illumination beam 334 to vary. Thus, as the passband wavelength of wavelength tunable filter 350 is varied, each image acquired by the array detector 360 will be acquired at the instantaneous passband wavelength selected by the wavelength tunable filter 350. As in semiconductor processing system 600, the controller 380 of semiconductor processing system 1600 controls the controllable gap $G_i$ to execute a sweep of passband wavelengths, and similarly, acquired images are received by the controller 380. In all other respects, the operation of semiconductor processing system 1600 is the same as operation of semiconductor processing system 600, described previously, and acquired "image stacks" or "image cubes" are the same. The same modification of wavelength tunable filter 350 location can also be made in semiconductor processing system 500, of FIG. 3A.

Semiconductor processing systems 1400 and 1600 both utilize reflectometry for diagnosing the process outcome on the substrate. Thus, the foregoing discussion of methods for extraction of diffracted optical spectra 950 (FIGS. 5A, 5B, and 5C), establishing a spatial correspondence of pixel locations in images of image cubes and locations on the substrate, selecting region(s) of pixels 940 (FIGS. 5A, 5B, and 5C) for extraction of diffracted optical spectra 950, properties of layers and features that can be determined, and the attendant advantages thereof, regarding semiconductor processing systems 300, 400, 500, and 600, all apply also to semiconductor processing systems 1400 and 1600.

The foregoing discussion has focused on the use of Fabry Perot cavities for hyperspectral imaging (HSI), for its good spectral resolution in the 2 nm range, and its ability to improve the signal to noise ratio (SNR) without sacrificing throughput. With these characteristics, the Fabry Perot cavity may be used as a replacement for fast compact spectrometers in many semiconductor diagnostic applications. Other filters, such as an acousto-optic tunable filter, and a liquid crystal tunable can also be used in certain applications, but their performance varies, particularly spectral resolution and speed of passband wavelength switching. Hyperspectral imaging (HSI) is also possible using sets of thin-layer bandpass filters, as is done in some remote sensing applications, such as military applications, and agricultural and land management applications. The spectral resolution of these filters is in the range of 1 to 10 nm, which may be entirely appropriate for certain less critical applications, and when not many wavelengths or closely-spaced wavelengths need to be sampled.

Lenses used in collecting optics 145, 245, 345, 745, and objective lens 748 of embodiments described previously may be telecentric, or bi-telecentric (i.e. telecentric in both object space and image space) to ensure parallelism of rays, a constant image magnification regardless of depth, or both. In embodiments of FIGS. 1A,B, a bi-telecentric lens provides a better balance of plasma optical emissions sampled across the field of view and depth, in a plasma processing chamber. In embodiments of FIGS. 2A,B, 3A,B, 4A,B, 6A,B a bi-telecentric lens ensures equal magnification and equal contributions from different portions of the acquired image at different locations and with different depths.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. An optical detector for detecting an optical signal from a semiconductor processing system, the optical detector being configured for detecting an optical signal transmitted through a window mounted in a wall of the semiconductor processing system, the optical detector comprising:
   collecting optics, configured for collecting and transmitting the optical signal transmitted by the window;
   a tunable Fabry Perot cavity for tunably selecting a wavelength of the transmitted optical signal;
   an array detector for detecting the wavelength-filtered optical signal; and
   a controller for controlling at least the tunable Fabry Perot cavity and array detector, and for storing and processing images acquired by the array detector.

2. The apparatus of claim 1, wherein the semiconductor processing system is a plasma processing system, and the optical signal comprises a plasma optical emission signal.

3. The apparatus of claim 1, wherein the optical signal comprises a diffracted optical signal, the diffracted optical signal being formed by reflecting and diffracting an illumination beam from a surface of the substrate disposed in the semiconductor processing system.

4. The apparatus of claim 3, wherein the wavelength tunable filter is disposed in the illumination beam, for tunably selecting a wavelength of the illumination beam.

5. The apparatus of claim 3, wherein the illumination beam has an angle of incidence of 0 degrees upon the surface of the substrate, and the diffracted optical signal is acquired at an angle of reflection of 0 degrees.

6. The apparatus of claim 3, wherein the illumination beam has an angle of incidence upon the surface of the substrate from 0.1 degree to 89 degrees, and the diffracted optical signal is acquired at an angle of reflection from 0.1 degree to 89 degrees.

7. The apparatus of claim 1, wherein the collecting optics comprise a collecting lens, a steering mirror, an aperture, a polarizer, an optical fiber, or a combination of two of more thereof.

8. The apparatus of claim 1, wherein the array detector is one-dimensional or two-dimensional.

9. The apparatus of claim 1, wherein the array detector comprises a CCD detector array, CMOS detector array, photodiode array, or a combination of two or more thereof.

10. The apparatus of claim 1, wherein the controller is configured to selectively tune a passband wavelength of the wavelength tunable filter, across a range or multiple overlapping or non-overlapping ranges of wavelengths in the deep ultraviolet (DUV), ultraviolet (UV), visible (VIS), and infrared (IR) portions of the optical spectrum.

11. The apparatus of claim 10, wherein the controller is configured to acquire an image cube, the image cube consisted of a set of images acquired by the array detector, each image in the set being acquired at a wavelength defined by an instantaneous passband wavelength to which the wavelength tunable filter is tuned.

12. A semiconductor processing system, comprising:
    a window mounted in a wall of the semiconductor processing system;
    collecting optics, configured for collecting and transmitting an optical signal transmitted by the window from the semiconductor processing system;
    a tunable Fabry Perot cavity for tunably selecting a wavelength of the transmitted optical signal;
    an array detector for detecting the wavelength-filtered optical signal; and
    a controller for controlling at least the tunable Fabry Perot cavity and array detector, and for storing and processing images acquired by the array detector.

13. The system of claim 12, wherein the semiconductor processing system is a plasma processing system, and the optical signal comprises a plasma optical emission signal.

14. The system of claim 12, wherein the optical signal comprises a diffracted optical signal, the diffracted optical signal being formed by reflecting and diffracting an illumination beam from a surface of a substrate disposed in the semiconductor processing system.

15. The system of claim 14, wherein the wavelength tunable filter is disposed in the illumination beam, for tunably selecting a wavelength of the illumination beam.

16. A substrate inspection system comprising:
    a stage for receiving a substrate to be inspected;
    an illumination light source, for illuminating the substrate;
    collecting optics, configured for collecting and transmitting an optical signal caused by illuminating the substrate;
    a tunable Fabry Perot cavity filter for tunably selecting a wavelength of the transmitted optical signal;
    an array detector for detecting the wavelength-filtered optical signal; and
    a controller for controlling at least the tunable Fabry Perot cavity and array detector, and for storing and processing images acquired by the array detector.

* * * * *